(12) United States Patent
Kim et al.

(10) Patent No.: US 11,574,959 B2
(45) Date of Patent: Feb. 7, 2023

(54) DISPLAY APPARATUS, AND APPARATUS AND METHOD OF MANUFACTURING THE SAME

(71) Applicant: Samsung Display Co., Ltd., Yongin-si (KR)

(72) Inventors: Inbae Kim, Yongin-si (KR); Minho Moon, Yongin-si (KR); Kyuhwan Hwang, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 96 days.

(21) Appl. No.: 16/847,208

(22) Filed: Apr. 13, 2020

(65) Prior Publication Data
US 2021/0028248 A1 Jan. 28, 2021

(30) Foreign Application Priority Data

Jul. 25, 2019 (KR) .......................... 10-2019-0090490

(51) Int. Cl.
*H01L 27/32* (2006.01)
*H01L 51/52* (2006.01)
(Continued)

(52) U.S. Cl.
CPC ........ *H01L 27/3218* (2013.01); *C23C 14/042* (2013.01); *C23C 16/042* (2013.01);
(Continued)

(58) Field of Classification Search
CPC ... H01L 27/3211–3218; H01L 51/5225; H01L 51/3276; H01L 51/3279
See application file for complete search history.

(56) References Cited

U.S. PATENT DOCUMENTS 9,847,486 B2 * 12/2017 Park .................... H01L 27/3272
9,911,941 B2 * 3/2018 Choi ................... H01L 27/3216
(Continued)

FOREIGN PATENT DOCUMENTS

KR 10-2009-0046640 A * 5/2009 ............... G03F 7/09
KR 10-1223727 1/2013
(Continued)

OTHER PUBLICATIONS

Machine translation, Seo, Korean Pat. Pub. No. 20090046640A, translation date: Nov. 28, 2021, Espacenet, all pages. (Year: 2021).*

*Primary Examiner* — Victoria K. Hall
(74) *Attorney, Agent, or Firm* — Kile Park Reed & Houtteman PLLC

(57) ABSTRACT

A display apparatus includes a substrate including first and display areas, wherein the first display area includes first and second pixel areas and a transmission area; a first pixel disposed in the first pixel area and including a first pixel electrode, a first counter electrode, and a first intermediate layer between the first electrode and the first counter electrode; and a second pixel disposed in the second pixel area and including a second pixel electrode, a second counter electrode, and a second intermediate layer between the second pixel electrode and the second counter electrode. The first and second counter electrodes are disposed in the first and second pixel areas, and the first and the second counter electrodes include a first contact area where the first and the second pixel areas are adjacent to each other. A method of manufacturing the display apparatus is provided.

33 Claims, 29 Drawing Sheets

(51) Int. Cl.
  *H01L 51/56* (2006.01)
  *H01L 51/00* (2006.01)
  *C23C 16/458* (2006.01)
  *C23C 16/04* (2006.01)
  *C23C 14/04* (2006.01)

(52) U.S. Cl.
  CPC ...... *C23C 16/4583* (2013.01); *H01L 27/3216* (2013.01); *H01L 27/3246* (2013.01); *H01L 51/0021* (2013.01); *H01L 51/5206* (2013.01); *H01L 51/5225* (2013.01); *H01L 51/56* (2013.01); *H01L 27/326* (2013.01); *H01L 2227/323* (2013.01)

(56) References Cited

U.S. PATENT DOCUMENTS

| | | | |
|---|---|---|---|
| 10,381,423 | B2 | 8/2019 | Jung |
| 11,016,349 | B2* | 5/2021 | Kim .................. H01L 51/5225 |
| 11,061,295 | B2* | 7/2021 | Bang .................... G02F 1/1368 |
| 11,171,317 | B2* | 11/2021 | Oh ...................... H01L 27/3227 |
| 11,239,290 | B2* | 2/2022 | Jang ..................... H01L 27/326 |
| 11,355,567 | B2* | 6/2022 | Hwang ............... H01L 27/3218 |
| 11,362,153 | B2* | 6/2022 | Jeon .................. H01L 27/3276 |
| 11,411,056 | B2* | 8/2022 | Ma ...................... H01L 27/3218 |
| 2002/0014837 | A1* | 2/2002 | Kim ..................... G09G 3/3216 |
| | | | 313/505 |
| 2011/0266944 | A1* | 11/2011 | Song .................... C23C 14/243 |
| | | | 313/504 |
| 2014/0242737 | A1* | 8/2014 | Chung .................. B05C 21/005 |
| | | | 438/35 |
| 2015/0011075 | A1* | 1/2015 | Han ........................ C23C 14/54 |
| | | | 438/478 |
| 2015/0054719 | A1* | 2/2015 | Lee ...................... H01L 27/326 |
| | | | 345/76 |
| 2015/0364715 | A1* | 12/2015 | Yoon .................. H01L 51/5225 |
| | | | 257/40 |
| 2016/0322595 | A1* | 11/2016 | Choi ................... H01L 27/3216 |
| 2017/0077404 | A1* | 3/2017 | Park ................... H01L 27/3211 |
| 2017/0194390 | A1* | 7/2017 | Kim ................... H01L 27/3276 |
| 2018/0129328 | A1 | 5/2018 | Park et al. |
| 2019/0181201 | A1* | 6/2019 | Kim ................... H01L 51/5234 |
| 2019/0355793 | A1* | 11/2019 | Oh ...................... H01L 51/5253 |
| 2019/0371874 | A1* | 12/2019 | Lee .................... H01L 51/5206 |
| 2020/0124927 | A1* | 4/2020 | Kim ................... H01L 27/3218 |
| 2020/0143771 | A1* | 5/2020 | Choong ..................... G09G 5/14 |
| 2020/0227508 | A1* | 7/2020 | Kim ...................... H01L 27/326 |
| 2020/0373372 | A1* | 11/2020 | Chung ............... H01L 27/3276 |
| 2020/0381489 | A1* | 12/2020 | Hwang ............... H01L 27/3246 |
| 2020/0411605 | A1* | 12/2020 | Moon ................. H01L 27/3218 |
| 2021/0020704 | A1* | 1/2021 | Kim ...................... H01L 51/56 |
| 2021/0036070 | A1* | 2/2021 | Jeon ..................... H01L 27/326 |
| 2021/0371968 | A1* | 12/2021 | Higuchi ............ H01L 21/28506 |

FOREIGN PATENT DOCUMENTS

| | | |
|---|---|---|
| KR | 10-2014-0107928 | 9/2014 |
| KR | 10-2015-0006247 | 1/2015 |
| KR | 10-2016-0130042 | 11/2016 |
| KR | 10-2017-0128663 | 11/2017 |
| KR | 10-2018-0050473 | 5/2018 |

* cited by examiner

DISPLAY APPARATUS, AND APPARATUS AND METHOD OF MANUFACTURING THE SAME

CROSS-REFERENCE TO RELATED APPLICATION

This application claims priority to and benefits of Korean Patent Application No. 10-2019-0090490 under 35 U.S.C. § 119, filed in the Korean Intellectual Property Office on Jul. 25, 2019, the entire contents of which are incorporated herein by reference.

BACKGROUND

1. Field

The disclosure relates to an apparatus and method, and, to a display apparatus, and an apparatus and method of manufacturing the display apparatus.

2. Description of Related Art

Display apparatuses are being used for various purposes. Because thicknesses and weights of display apparatuses have decreased, the range and number of applications to which display apparatuses are being applied have increased.

As display apparatuses have been widely used, there may be various methods of designing shapes of the display apparatuses and various functions linked to or associated with the display apparatuses have increased.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In order to increase a function linked to or associated with a display apparatus, such as, for example, improved visibility, one or more embodiments of the disclosure may provide a display apparatus including a sensor area where a sensor and so on may be located or disposed inside a display area, and an apparatus and method of manufacturing the display apparatus. However, the above problem is an example, and thus does not limit the scope of the disclosure.

Additional aspects will be set forth in part in the description which follows and, in part, will be apparent from the description, or may be learned by practice of the embodiments.

According to one or more embodiments, a display apparatus may include a substrate including a first display area and a second display area, the first display area including a first pixel area, a second pixel area, and a transmission area, a first pixel disposed in the first pixel area and including a first pixel electrode, a first counter electrode, and a first intermediate layer disposed between the first pixel electrode and the first counter electrode, and a second pixel disposed in the second pixel areas and including a second pixel electrode, a second counter electrode, and a second intermediate layer disposed between the second pixel electrode and the second counter electrode, wherein the first counter electrode may be disposed in the first pixel area, the second counter electrode may be disposed in the second pixel area, and the first counter electrode and the second counter electrode may include a first contact area where the first pixel area and the second pixel area are adjacent to each other. The first counter electrode and the second counter electrode may be electrically connected to each other through the first contact area.

The first and second pixel areas and the transmission area may be alternately arranged in a lattice shape.

The transmission area may be defined by the first pixel area and the second pixel area that are adjacent to each other.

The first contact area may be an area where the first counter electrode and the second counter electrode are in surface contact with each other.

In the first contact area, the second counter electrode may be disposed on the first counter electrode.

The display apparatus may include a pixel-defining layer disposed on the first pixel electrode and the second pixel electrode and including a first opening and a second opening through which portions of the first pixel electrode and the second pixel electrode are respectively exposed, wherein the first contact area may be disposed on the pixel-defining layer.

Light transmittances of the first display area and the second display area may be different from each other.

A resolution of an image provided in the first display area may be less than a resolution of an image provided in the second display area.

The second display area may include a third pixel area and a fourth pixel area that are adjacent to each other, wherein the display apparatus includes a third pixel disposed in the third pixel area and including a third pixel electrode, a third counter electrode, and a third intermediate layer disposed between the third pixel electrode and the third counter electrode, and a fourth pixel disposed in the fourth pixel and including a fourth pixel electrode, a fourth counter electrode, and a fourth intermediate layer disposed between the fourth pixel electrode and the fourth counter electrode, wherein the third counter electrode and the fourth counter electrode may include a second contact area where the third pixel area and the fourth pixel area adjacent to each other. The third counter electrode and the fourth counter electrode are electrically connected to each other through the second contact area.

The third counter electrode or the fourth counter electrode may protrude toward the first display area. The third counter electrode may be electrically connected to the first counter electrode or the fourth counter electrode may be electrically connected to the second counter electrode to form a third contact area.

The fourth counter electrode may be disposed on the first counter electrode in the third contact area.

The display apparatus may include a pixel-defining layer disposed on the third pixel electrode and the fourth pixel electrode, wherein at least one of the second contact area and the third contact area may be disposed on the pixel-defining layer.

The fourth counter electrode may be disposed on the third counter electrode in the second contact area.

The third counter electrode, the fourth counter electrode, and the second contact area may be disposed to cover an entire surface of the second display area.

Each of the third counter electrode and the fourth counter electrode may have a stripe shape.

The first counter electrode and the third counter electrode may be aligned with each other, and the second counter electrode and the fourth counter electrode may be aligned with each other.

The substrate may include a non-display area surrounding at least a part of the second display area, wherein at least one of the third counter electrode and the fourth counter electrode may protrude from the second display area toward the non-display area.

According to one or more embodiments, a display apparatus includes a substrate including a first display area and a second display area, the first display area including a first pixel area, a second pixel area, and a transmission area, a first pixel disposed in the first pixel area and including a first pixel electrode, a first counter electrode, and a first intermediate layer disposed between the first pixel electrode and the first counter electrode, a second pixel disposed in the second pixel area and including a second counter electrode, and a second intermediate layer disposed between the second pixel electrode and the second counter electrode, and a component disposed on one surface of the substrate to correspond to the first display area and including an electronic element that emits or receives light, wherein the first counter electrode may be disposed in the first pixel areas that are spaced apart from each other, the second counter electrode may be disposed in the second pixel areas that are spaced apart from each other, and the first counter electrode and the second counter electrode may include a first contact area where the first pixel area and the second pixel area may be adjacent to each other.

The component may emit or receive light through the transmission area, and a light transmittance of the second display area may be less than a light transmittance of the first display area.

According to one or more embodiments, an apparatus for manufacturing a display apparatus includes a chamber having a part selectively opened or closed; a first support disposed inside the chamber and supporting a substrate, a mask assembly disposed inside the chamber to face the substrate, a second support disposed inside the chamber and supporting the mask assembly, and a deposition source disposed in the chamber and supplying a deposition material to the substrate, wherein the mask assembly includes a mask frame, and a mask sheet disposed on the mask frame, wherein the mask sheet includes a first opening and a second opening disposed in a portion of the mask sheet different from the first opening, the first opening and the second opening are aligned with each other, and a width of the mask sheet between the first opening and the second opening that are adjacent to each other is larger than a width of the mask sheet between the second opening and another second opening that are adjacent to each other.

In an embodiment, shapes of the first opening and the second opening may be different from each other The deposition source may be disposed on an edge portion of the chamber.

The first opening may have a substantially square shape and the second opening may have a substantially rectangular shape.

At least one of the first support and the second support may adjusts relative positions of the substrate and the mask assembly.

According to one or more embodiments, a method of manufacturing a display apparatus includes disposing a substrate and a mask assembly inside a chamber, passing a deposition material supplied by a deposition source through the mask assembly to form a first counter electrode and a third counter electrode respectively in a first display area and a second display area of the substrate, changing a position of at least one of the substrate and the mask assembly, and passing a deposition material supplied by the deposition source through the mask assembly to form a second counter electrode at least partially overlapping the first counter electrode in the first display area, and a fourth counter electrode at least partially overlapping the third counter electrode in the second display area.

An embodiment may include forming a first contact area where the first counter electrode and the second counter electrode overlap each other, and forming a second contact area where the third counter electrode and the fourth counter electrode overlap each other. The first contact area and the second contact area may be formed on a pixel-defining layer.

The disposing the substrate may include disposing a non-display area surrounding at least a part of the second display area, and disposing a part of at least one of the third counter electrode and the fourth counter electrode to protrude from the second display area toward the non-display area.

An embodiment may include disposing a transmission area between the first counter electrode and the second counter electrode.

An embodiment may include forming the third counter electrode, the fourth counter electrode, and a second contact area where the third counter electrode and the fourth counter electrode overlap each other to cover an entire surface of the second display area.

An embodiment may include forming a first contact area where the first counter electrode and the second counter electrode may overlap each other and may be in surface contact with each other.

An embodiment may include forming a second contact area where the third counter electrode and the fourth counter electrode may overlap each other and may be in surface contact with each other.

Light transmittances of the first display area and the second display area may be different from each other.

An embodiment may include forming a third contact area where at least one of the third counter electrode and the fourth counter electrode may protrude toward the first display area. The third contact area may be electrically connected to at least one of the first counter electrode and the second counter electrode.

An embodiment may include forming the first counter electrode to comprise the first counter electrodes, at least one of the first counter electrodes and the third counter electrode may be arranged in a first direction, and others of the first counter electrodes may be arranged in a second direction different from the first direction.

An embodiment may include forming the first counter electrode and the second counter electrode to be connected in a third direction different from the first direction and the second direction.

Other aspects, features, and advantages will become apparent and more readily appreciated from the following description of the embodiments, the claims, and the accompanying drawings.

These general embodiments may be implemented by using a system, a method, a computer program, or a combination thereof, a computer, a processor, or other hardware within the scope of the disclosure.

BRIEF DESCRIPTION OF THE DRAWINGS

The above and other aspects, features, and advantages of the disclosure will be more apparent from the following description taken in conjunction with the accompanying drawings, in which.

DETAILED DESCRIPTION OF THE EMBODIMENTS

Figure 1:
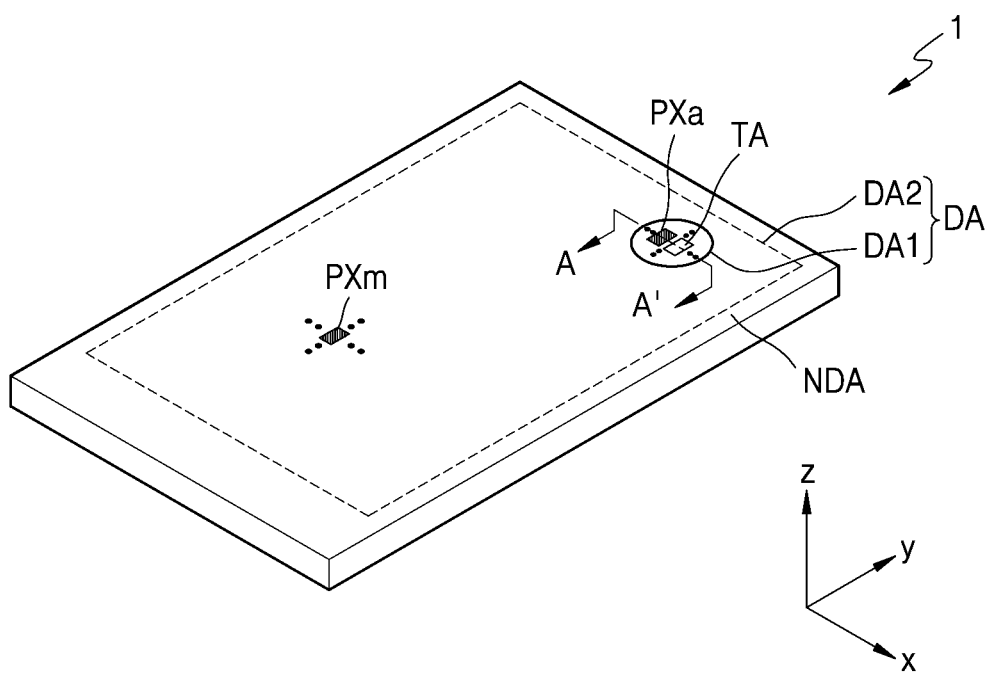
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Reference will now be made in detail to embodiments, examples of which are illustrated in the accompanying drawings, and in the drawings, the same elements are denoted by the same reference numerals and a repeated explanation thereof will not be given.

It will be understood that although the terms "first," "second," etc. may be used herein to describe various elements, these elements should not be limited by these terms and are only used to distinguish one element from another.

As used herein, the singular forms "a," "an," and "the" are intended to include the plural forms as well, unless the context clearly indicates otherwise.

It will be further understood that the terms "comprises" and/or "comprising", "includes" and/or "including", used herein specify the presence of stated features or components, but do not preclude the presence or addition of one or more other features or components.

It will be understood that when a layer, region, or element is referred to as being "formed on," another layer, region, or element, it may be directly formed on the other layer, region, or element, or intervening layers, regions, or elements may be present therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity Sizes of elements may be exaggerated for convenience of explanation. For example, because sizes and thicknesses of elements in the drawings may be arbitrarily illustrated for convenience of explanation, the following embodiments are not limited thereto.

Further, in the specification, the phrase "in a plan view" means when an object portion is viewed from above, and the phrase "in a schematic cross-sectional view" means when a schematic cross-section taken by vertically cutting an object portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Throughout the specification, when an element is referred to as being "connected" to another element, the element may be "directly connected" to another element, or "electrically connected" to another element with one or more intervening elements interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a specific process order may be different from the described order. For example, two consecutively described processes may be performed substantially at the same time or performed in an order opposite to or different from the described order.

FIG. 1 is a perspective view of a display apparatus according to an embodiment.

Referring to FIG. 1, a display apparatus 1 includes a display area DA where an image may be formed and a non-display area NDA where an image may not be formed. The display area DA may include a second display area DA2 and a first display area DA1 located or disposed in the second display area DA2. The display apparatus 1 may provide a main image by using light emitted by main pixels PXm located or disposed in the second display area DA2.

The first display area DA1 may be an area under which a component, for example, a sensor using infrared rays, visible light, and/or sound may be located or disposed. An embodiment thereof will be described below with reference to FIG. 2. The first display area DA1 may include a transmission area TA through which light and/or sound output from the component to the outside or traveling from the outside toward the component may be transmitted. According to an embodiment, when infrared rays, for example, are transmitted through the first display area DA1, a light transmittance of the first display area DA1 may be equal to or greater than about 10%, or for example, equal to or greater than about 20%, about 25%, about 50%, about 85%, or about 90%. The light transmittance of the first display area DA1 may be different from a light transmittance of the second display area DA2. For example, a light transmittance of the first display area DA1 may be greater than a light transmittance of the second display area DA2.

In the embodiment, auxiliary pixels PXa may be located or disposed in the first display area DA1, and an image may be provided by using light emitted by the auxiliary pixels PXa. An image provided in the first display area DA1 may be an auxiliary image and may have a resolution less than that of an image provided in the second display area DA2. For example, because the first display area DA1 includes the first transmission area TA through which light and/or sound may be transmitted, the number of auxiliary pixels PXa that may be located or disposed per unit area may be less than the number of main pixels PXm located or disposed per unit area in the second display area DA2.

The first display area DA1 may be at least partially surrounded by the second display area DA2. In other embodiments, the first display area DA1 may be entirely surrounded by the second display area DA2 in FIG. 1.

Although an organic light-emitting display apparatus will be described as the display apparatus 1 according to an embodiment, the display apparatus 1 is not limited thereto. In other embodiments, the display apparatus 1 may be any of various display apparatuses, for example, an inorganic electroluminescent (EL) display or a quantum dot light-emitting display.

Although the first display area DA1 is located or disposed on a side (for example, upper right side) of the second display area DA2 having a quadrangular shape, the disclosure is not limited thereto. A shape of the second display area DA2 may be a circular shape, an elliptical shape, or a polygonal shape such as a triangular shape or a pentagonal shape, and locations and the number of the first display areas DA1 may be changed or arranged in various ways.

Figure 2:
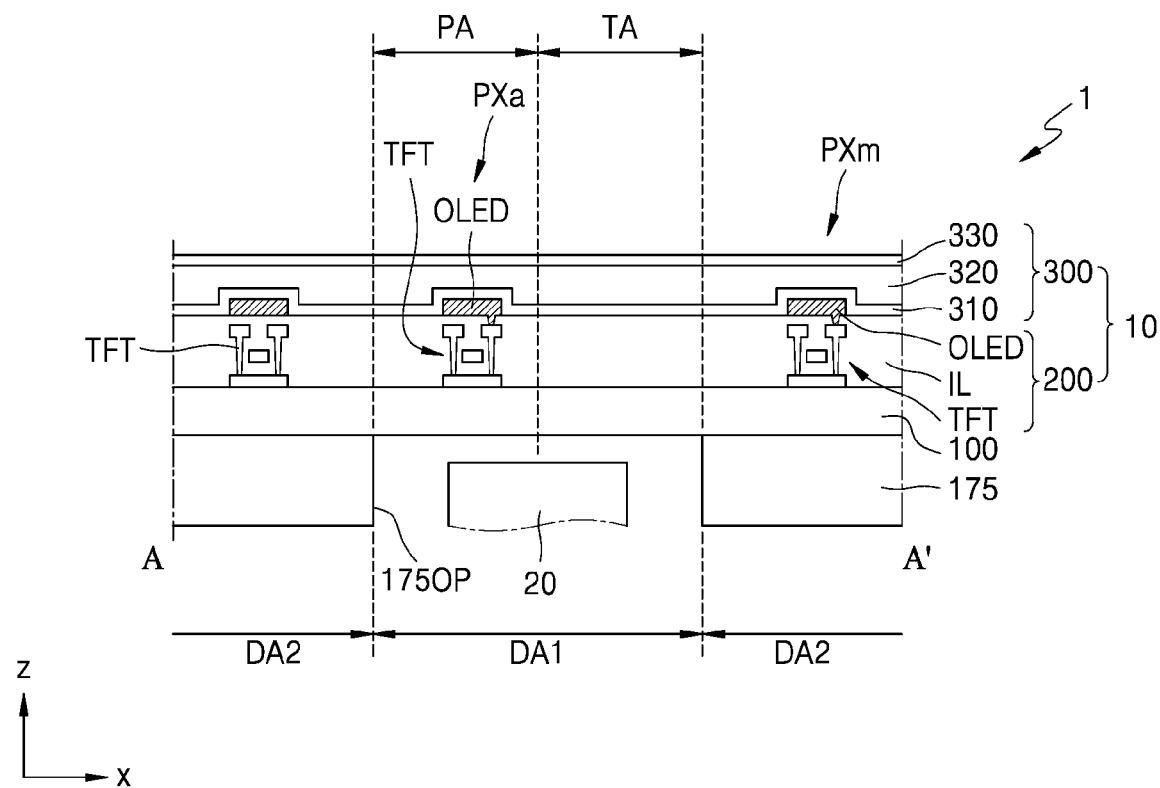
FIG. 2 is a schematic cross-sectional view of a display apparatus according to an embodiment.

FIG. 2 is a schematic cross-sectional view of a display apparatus according to an embodiment. FIG. 2 may be a schematic cross-sectional view taken along line A-A' of FIG. 1.

Referring to FIG. 2, the display apparatus 1 may include a display panel 10 including a display element and a component 20 which may be located or disposed under the display panel 10. The component 20 may be disposed in or corresponding to the first display area DA1.

The display panel 10 may include a substrate 100, a display element layer 200 located or disposed on the substrate 100, and a thin-film encapsulation layer 300 that may be a sealing member for sealing the display element layer 200. The display panel 10 may include a lower protective film 175 located or disposed under the substrate 100.

The substrate 100 may include glass or a polymer resin. The polymer resin may include a polymer resin, for example, polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. The substrate 100 including the polymer resin may be flexible, rollable, or bendable. The substrate 100 may have a multi-layer structure including a layer including the polymer resin and an inorganic layer (not shown).

The display element layer 200 may include a circuit layer including a thin-film transistor (TFT), an organic light emitting diode (OLED) that is a display element, and an insulating layer IL between the circuit layer and the OLED.

The main pixel PXm including the TFT and the OLED connected to the TFT may be located or disposed in the second display area DA2. The auxiliary pixel PXa including the TFT and the OLED connected to the TFT may be located or disposed in the first display area DA1. Wirings (not shown) electrically connected to the main pixel PXm and the auxiliary pixel PXa may be located or disposed in the display apparatus 1.

The transmission area TA where a TFT and a pixel are not located or disposed may be located or disposed in the first display area DA1. The transmission area TA may be an area through which light or signal emitted from the component 20 or light or signal incident on the component 20 may be transmitted.

The component 20 may be located or disposed in the first display area DA1. The component 20 may be an electronic element using light or sound. Examples of the component 20 may include a sensor for receiving and using light such as an infrared sensor, a sensor for outputting and detecting light or sound to measure a distance or recognize a fingerprint or the like, a small lamp for outputting light, and a speaker for outputting sound. When the component 20 is an electronic element using light, the component 20 may use light of various wavelength bands, for example, visible light, infrared light, or ultraviolet light. In other embodiments, multiple components 20 may be provided in the first display area DA1. For example, a light-emitting element and a light-receiving element may be provided together as a component in one first display area DA1. As another example, a light emitter and a light receiver may be simultaneously provided in one component.

The thin-film encapsulation layer 300 may include at least one inorganic encapsulation layer and at least one organic encapsulation layer. In this regard, FIG. 2 illustrates first and second inorganic encapsulation layers 310 and 330 and an organic encapsulation layer 320 located or disposed between the first and second inorganic encapsulation layers 310 and 330.

Each of the first and second inorganic encapsulation layers 310 and 330 may include at least one inorganic insulating material from among, but not limited to, aluminum oxide, titanium oxide, tantalum oxide, hafnium oxide, zinc oxide, silicon oxide, silicon nitride, silicon oxynitride, and a combination thereof. The organic encapsulation layer 320 may include a polymer-based material. The polymer-based material may include, but not limited to, polyethylene terephthalate, polyethylene napthalate, polycarbonate, polyimide, polyethylene sulfonate, polyoxymethylene, polyarylate, hexamethyldisiloxane (HMDSO), an acrylic resin (for example, polymethyl methacrylate (PMMA) or polyacrylic acid), or a combination thereof.

The lower protective film 175 may be attached to the bottom of the substrate 100 and may support and protect the substrate 100. The lower protective film 175 may include an opening 1750P located or disposed in the first display area DA1. Because the opening 1750P may be formed in the lower protective film 175, a light transmittance of the first display area DA1 may be increased. The lower protective film 175 may include polyethylene terephthalate or polyimide.

The area of the first display area DA1 may be greater than the area of a region where the component 20 is located or disposed. Although the area of the first display area DA1 and the area of the opening 1750P are substantially the same in the embodiment of FIG. 2, the area of the opening 1750P of the lower protective film 175 may be different from the area of the first display area DA1. For example, the area of the opening 1750P may be less than the area of the first display area DA1.

Although not shown in FIG. 2, an input sensing member for sensing a input (for example, a touch input), an anti-reflection member including a polarizer, a retarder, a color filter, or a black matrix, and a transparent window may be further located or disposed on the display panel 10.

Although the thin-film encapsulation layer 300 may be used as a sealing member for sealing the display element layer 200 in the embodiment, the disclosure is not limited thereto. For example, a sealing substrate attached to the substrate 100 by using a sealant or frit may be used as a member for sealing the display element layer 200.

Figure 3:
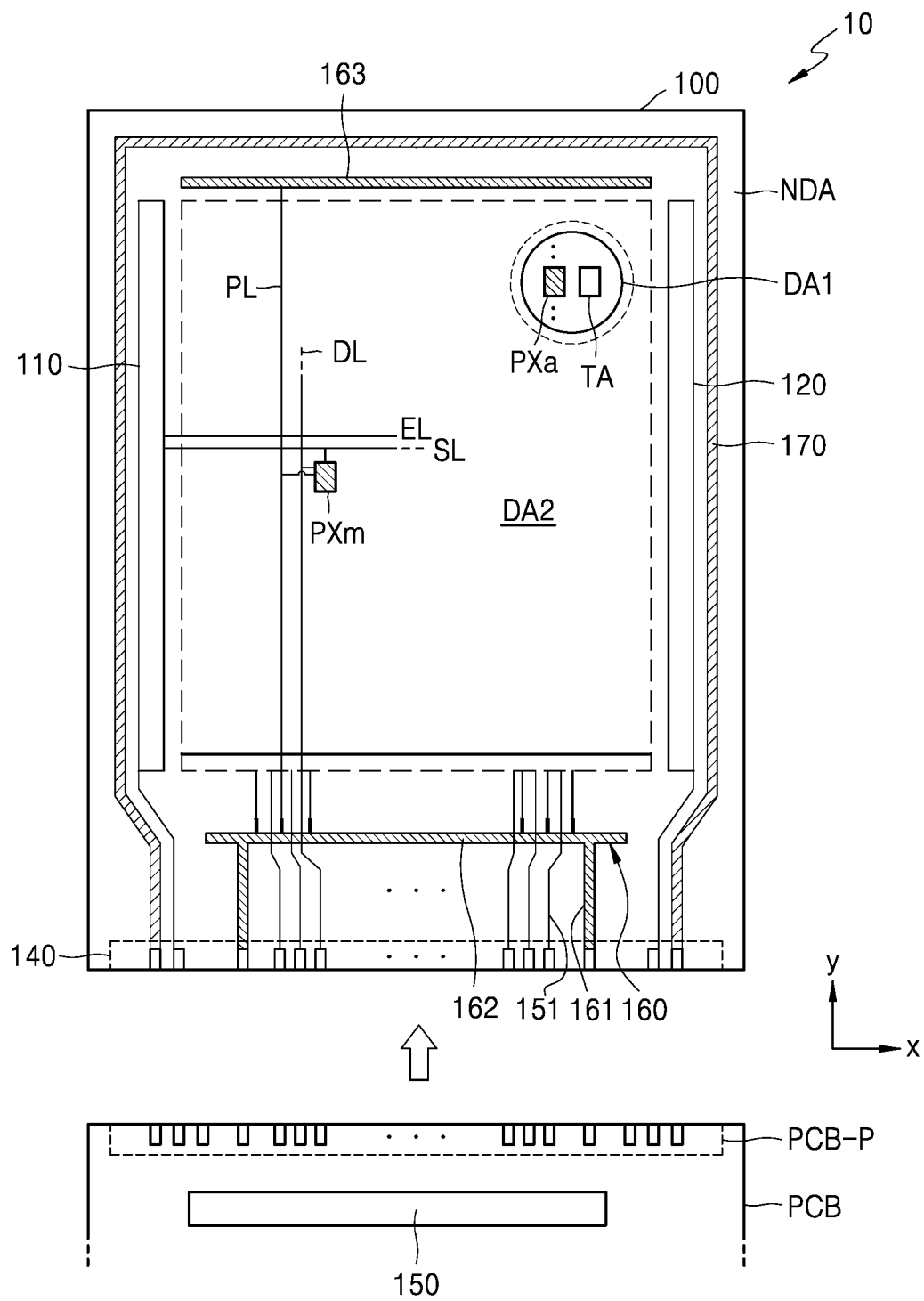
FIG. 3 is a plan view of a display panel according to an embodiment.
Figure 4:
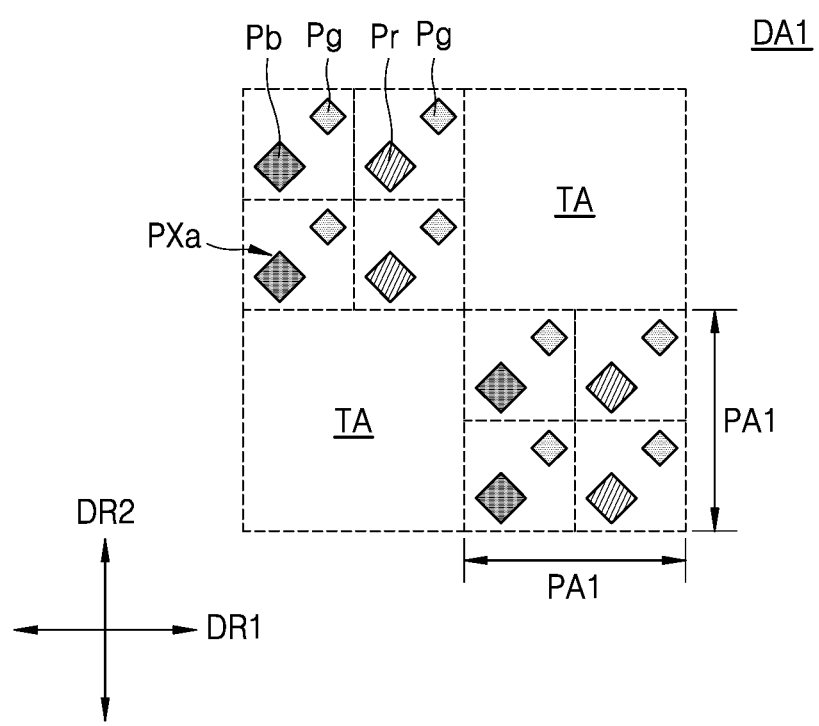
FIG. 4 is an enlarged plan view illustrating a first display area of FIG. 3 according to an embodiment.

FIG. 3 is a plan view of a display panel according to an embodiment. FIG. 4 is an enlarged plan view of a first display area of FIG. 3 according to an embodiment.

Referring to FIGS. 3 and 4, various elements of the display panel 10 may be located or disposed on the substrate 100. The substrate 100 may include the display area DA and the non-display area NDA surrounding the display area DA. The display area DA may include the second display area DA2 where a main image may be displayed, and the first display area DA1, including the transmission area TA, where an auxiliary image may be displayed.

The main pixels PXm may be located or disposed in the second display area DA2. Each of the main pixels PXm may include a display element, for example, an organic light-emitting display device (OLED). Each main pixel PXm may emit, for example, red, green, blue, or white light, from the OLED. The main pixel PXm used herein may refer to a pixel that emits light of one color from among red light, green light, blue light, and white light. The second display area DA2 may be covered by an encapsulation member described with reference to FIG. 2 such that the encapsulation member protects the second display area DA2 from external air or moisture.

The first display area DA1 may be located or disposed inside the second display area DA2, and the auxiliary pixels PXa may be located or disposed in the first display area DA1. Each of the auxiliary pixels PXa may include a display element, for example, an OLED. Each auxiliary pixel PXa may emit light, for example, red, green, blue, or white light, from the OLED. The auxiliary pixel PXa used herein may refer to a pixel that emits light of one color from among red light, green light, blue light, and white light as described above. The transmission area TA located or disposed between the auxiliary pixels PXa may be provided in the first display area DA1.

Because the first display area DA1 includes the transmission area TA, a resolution of the first display area DA1 may be less than that of the second display area DA2. For example, a resolution of the first display area DA1 may be about ½ of that of the second display area DA2. In some embodiments, a resolution of the second display area DA2 may be equal to or greater than about 400 ppi and a resolution of the first display area DA1 may be about 200 ppi.

An embodiment of the first display area DA1 will be described with reference to FIG. 4.

The first display area DA1 may include an auxiliary pixel area PA1 including at least one auxiliary pixel PXa, and the transmission area TA. The auxiliary pixel area PA1 and the transmission area TA may be alternately arranged in a first direction DR1 and a second direction DR2, for example, in a lattice shape.

The auxiliary pixel area PA1 may include an auxiliary pixel Pr that emits red light, an auxiliary pixel Pg that emits green light, and an auxiliary pixel Pb that emits blue light. The auxiliary pixels PXa may be arranged in a pentile shape as shown FIG. 4, but the embodiment is not limited thereto. In other embodiments, the auxiliary pixels PXa may be arranged in a stripe shape or any of various shapes as may be understood and appreciated by those of ordinary skill in the art. Although eight auxiliary pixels PXa are provided in the auxiliary pixel area PA1 in FIG. 4, the number of auxiliary pixels PXa may vary according to a resolution of the first display area DA1 and the number of auxiliary pixels PXa is not limited thereto.

In an embodiment, one main pixel PXm and one auxiliary pixel PXa may include the same or similar pixel circuit. However, the disclosure is not limited thereto. A pixel circuit included in the main pixel PXm and a pixel circuit included in the auxiliary pixel PXa may be different from each other.

The auxiliary pixel PXa may not be located or disposed in the transmission area TA. When the auxiliary pixel PXa is not located or not disposed in the transmission area, for example, it may mean that the auxiliary pixel PXa does not include a display element such as an OLED. For example, when the auxiliary pixel PXa is not located or not disposed in the transmission area, this may mean that a pixel electrode, an intermediate layer, and a counter electrode constituting the OLED, and a pixel circuit electrically connected to the pixel electrode, the intermediate layer, and the counter electrode are not located or disposed in the transmission area TA. Parts of signal lines (for example, a driving voltage line PL, a data line DL, a scan line SL, and an emission control line EL) connected to apply a signal to the auxiliary pixel PXa located or disposed in the auxiliary pixel area PA1 may cross the transmission area TA. However, even in this case, in order to increase a transmittance of the transmission area TA, the signal lines (for example, the driving voltage line PL, the data line DL, the scan line SL, and the emission control line EL) may bypass a central portion of the transmission area TA.

A conductive layer (not shown) may be located or disposed on the substrate 100 to correspond to the auxiliary pixel area PA1 of the first display area DA1. The conductive layer may be located or disposed under the auxiliary pixel PXa, for example, between the TFT of the auxiliary pixel PXa and the substrate 100. The conductive layer may prevent external light emitted from the component 20 from being incident on a pixel circuit PC (see FIG. 5) of the auxiliary pixel PXa. As a result, the pixel circuit may not be affected by the external light. A constant voltage or a signal may be applied to the conductive layer, thereby preventing damage to the pixel circuit PC, which otherwise would have been resulted from electrostatic discharge. Conductive layers may be provided in the first display area DA1, and the conductive layers may receive different voltages.

Referring back to FIG. 3, the main and auxiliary pixels PXm and PXa may be electrically connected to outer circuits. A first scan driving circuit 110, a second scan driving circuit 120, a terminal 140, a data driving circuit 150, a first power supply wiring 160, and a second power supply wiring 170 may be located or disposed in the non-display area NDA.

The first scan driving circuit 110 may apply a scan signal to each of the main and auxiliary pixels PXm and PXa through the scan line SL. The first scan driving circuit 110 may apply an emission control signal to each pixel through the emission control line EL. The second scan driving circuit 120 may be parallel to the first scan driving circuit 110 with the display area DA therebetween. Some of the main and auxiliary pixels PXm and PXa located or disposed in the display area DA may be electrically connected to the first scan driving circuit 110, and the others may be connected to the second scan driving circuit 120. In an embodiment, the second scan driving circuit 120 may be omitted.

The terminal 140 may be located or disposed at a side of the substrate 100. The terminal 140 may be exposed by not being covered by an insulating layer and may be electrically connected to a printed circuit board (PCB). A terminal PCB-P of the PCB may be electrically connected to the terminal 140 of the display panel 10. The PCB transmits a signal or power of a controller (not shown) to the display panel 10. A control signal generated by the controller may be transmitted to the first and second scan driving circuits 110 and 120 through the PCB. The controller may supply first power ELVDD and second power ELVSS (see FIGS. 5 and 6) respectively to the first and second power supply wirings 160 and 170. The first power ELVDD may be supplied to each of the main and auxiliary pixels PXm and PXa through the driving voltage line PL connected to the first power supply wiring 160, and the second power ELVSS may be supplied to a counter electrode of each of the main and auxiliary pixels PXm and PXa connected to the second power supply wiring 170.

The data driving circuit 150 is electrically connected to the data line DL. A data signal of the data driving circuit 150 may be applied to each of the main and auxiliary pixels PXm and PXa through a connection wiring 151 connected to the terminal 140 and the data line DL connected to the connection wiring 151. Although the data driving circuit 150 is located or disposed on the PCB in FIG. 3, in an embodiment, the data driving circuit 150 may be located or disposed on the substrate 100. For example, the data driving circuit 150 may be located or disposed between the terminal 140 and the first power supply wiring 160.

The first power supply wiring 160 may be located or disposed between the second display area DA2 and the terminal 140 and may include a first sub-wiring 162 and a second sub-wiring 163 extending in an x-direction to be parallel to each other. The second power supply wiring 170 may partially surround the display area DA in a loop shape having one open side.

Figure 5:
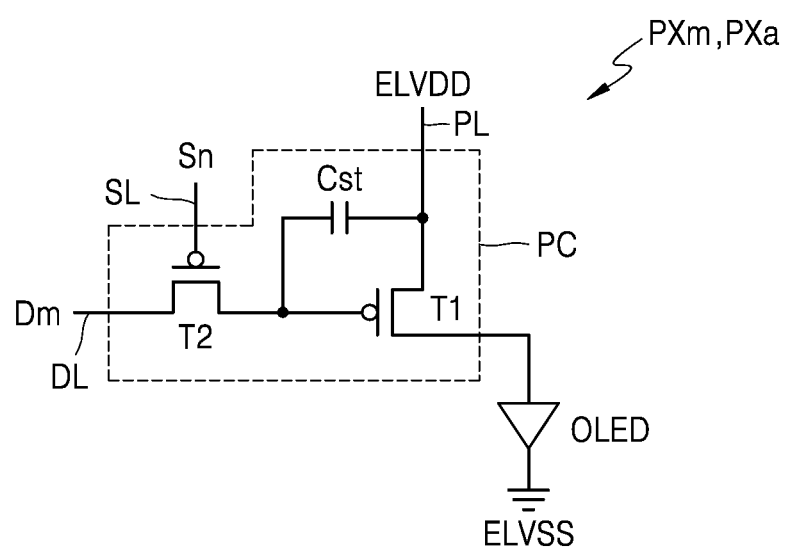
FIGS. 5 and 6 are schematic diagrams of equivalent circuits of a pixel of a display panel according to an embodiment.
Figure 6:
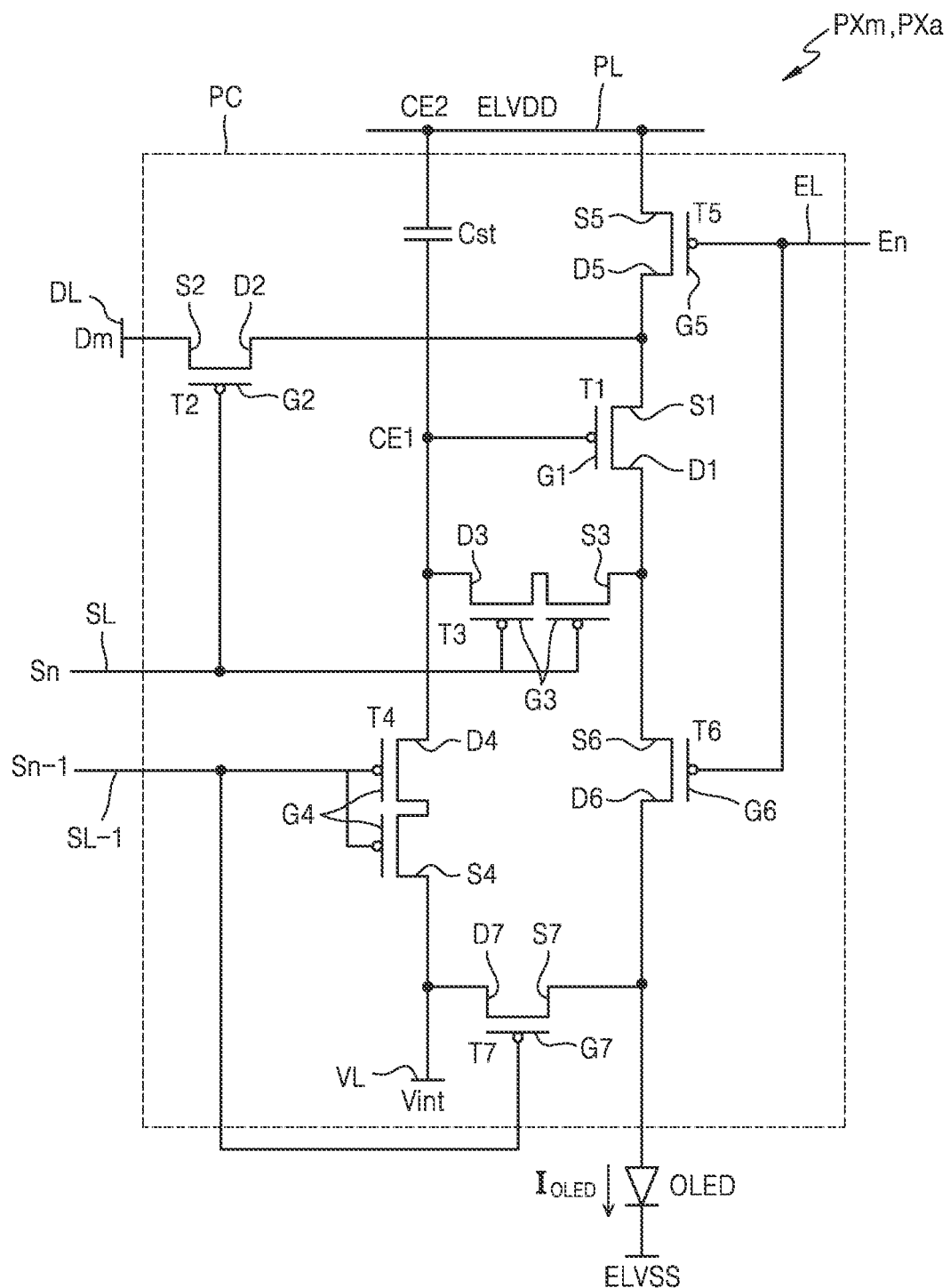

FIGS. 5 and 6 are schematic diagrams of equivalent circuits of a pixel of a display panel according to an embodiment.

Referring to FIGS. 5 and 6, each of the main and auxiliary pixels PXm and PXa may include the pixel circuit PC connected to the scan line SL and the data line DL and the OLED connected to the pixel circuit PC.

The pixel circuit PC may include a driving TFT T1, a switching TFT T2, and a storage capacitor Cst. The switching TFT T2 may be connected to the scan line SL and the data line DL, and may transmit a data signal Dm input through the data line DL to the driving TFT T1 according to a scan signal Sn input through the scan line SL.

The storage capacitor Cst may be connected to the switching TFT T2 and the driving voltage line PL, and may store a voltage corresponding to a voltage received from the switching TFT T2 and the first power ELVDD (or a driving voltage) supplied to the driving voltage line PL.

The driving TFT T1 may be connected to the driving voltage line PL and the storage capacitor Cst and may control driving current flowing through the OLED from the driving voltage line PL in response to the value of a voltage stored in the storage capacitor Cst. The OLED may emit light having a luminance according to the driving current.

Although the pixel circuit PC includes two TFTs and one storage capacitor in an embodiment of FIG. 5, the disclosure is not limited thereto. As shown in FIG. 6, the pixel circuit PC may include, for example, seven TFTs and one storage capacitor. Although the pixel circuit PC includes one storage capacitor in FIG. 6, the pixel circuit PC may include two or more storage capacitors. Accordingly, the number of TFTs and storage capacitors is not limited thereto and may vary according to embodiments.

Referring to FIG. 6, each of the main and auxiliary pixels PXm and PXa may include the pixel circuit PC and the OLED connected to the pixel circuit PC. The pixel circuit PC may include TFTs and a storage capacitor. The TFTs and the storage capacitor may be connected to signal lines (for example, the scan line SL, a previous scan line SL-1, the emission control line EL, and the data line DL), an initialization voltage line VL, and the driving voltage line PL.

Although the main and auxiliary pixels PXm and PXa are connected to the signal lines (for example, the scan line SL, a previous scan line SL-1, the emission control line EL, and the data line DL), the initialization voltage line VL, and the driving voltage line PL, the disclosure may not be limited thereto. In other embodiments, at least one of the signal lines (for example, the scan line SL, a previous scan line SL-1, the emission control line EL, and the data line DL), the initialization voltage line VL, and the driving voltage line PL may be shared by neighboring pixels.

Signal lines may include the scan line SL that transmits the scan signal Sn, the previous scan line SL-1 that transmits a previous scan signal Sn-1 to a first initialization TFT T4 and a second initialization TFT T7, the emission control line EL that transmits an emission control signal En to an operation control TFT T5 and an emission control TFT T6, and the data line DL that intersects the scan line SL and transmits the data signal Dm. The driving voltage line PL may transmit a driving voltage ELVDD to a driving TFT T1, and the initialization voltage line VL may transmit an initialization voltage Vint that initializes a pixel electrode and the driving TFT T1. The first and second initialization TFTs and operation and emission control TFTs are not limited to the above described embodiment.

A driving gate electrode G1 of the driving TFT T1 may be connected to a lower electrode CE1 of the storage capacitor Cst. A driving source electrode S1 of the driving TFT T1 may be connected to the lower driving voltage line PL via the operation control TFT T5. A driving drain electrode D1 of the driving TFT T1 may be electrically connected to a pixel electrode of a main OLED via the emission control TFT T6. The driving TFT T1 may receive the data signal Dm and supplies driving current $I_{OLED}$ to the main OLED according to a switching operation of the switching TFT T2.

A switching gate electrode G2 of the switching TFT T2 may be connected to the scan line SL. A switching source electrode S2 of the switching TFT T2 may be connected to the data line DL A switching drain electrode D2 of the switching TFT T2 may be connected to the driving source electrode Si of the driving TFT T1, and may be connected to the lower driving voltage line PL via the operation control TFT T5. The switching TFT T2 may be turned on according to the scan signal Sn received through the scan line SL and may perform a switching operation of transmitting the data signal Dm through the data line DL to the driving source electrode Si of the driving TFT T1.

A compensation gate electrode G3 of the compensation TFT T3 may be connected to the scan line SL. A compensation source electrode S3 of a compensation TFT T3 may be connected to the driving drain electrode D1 of the driving TFT T1, and may be connected to the pixel electrode of the OLED via the emission control TFT T6. A compensation drain electrode D3 of the compensation TFT T3 may be connected to the lower electrode CE1 of the storage capacitor Cst, a first initialization drain electrode D4 of the first initialization TFT T4, and the driving gate electrode G1 of the driving TFT T1. The compensation TFT T3 may be turned on according to the scan signal Sn received through the scan line SL, and may diode-connect the driving TFT T1 by electrically connecting the driving gate electrode G1 to the driving drain electrode D1 of the driving TFT T1.

A first initialization gate electrode G4 of the first initialization TFT T4 may be connected to the previous scan line SL-1. A first initialization source electrode S4 of the first initialization TFT T4 may be connected to a second initialization drain electrode D7 of the second initialization TFT T7 and the initialization voltage line VL. The first initialization drain electrode D4 of the first initialization TFT T4 may be connected to the lower electrode CE1 of the storage capacitor Cst, the compensation drain electrode D3 of the compensation TFT T3, and the driving gate electrode G1 of the driving TFT T1. The first initialization TFT T4 may be turned on according to the previous scan signal Sn-1 received through the previous scan line SL-1 and may perform an initialization operation of initializing a voltage of the driving gate electrode G1 of the driving TFT T1 by transmitting the initialization voltage Vint to the driving gate electrode G1 of the driving TFT T1.

An operation control gate electrode G5 of the operation control TFT T5 may be connected to the emission control line EL. An operation control source electrode S5 of the operation control TFT T5 may be connected to the lower driving voltage line PL. An operation control drain electrode D5 of the operation control TFT T5 may be connected to the driving source electrode S1 of the driving TFT T1 and the switching drain electrode D2 of the switching TFT T2.

An emission control gate electrode G6 of the emission control TFT T6 may be connected to the emission control line EL. An emission control source electrode S6 of the emission control TFT T6 may be connected to the driving drain electrode D1 of the driving TFT T1 and the compensation source electrode S3 of the compensation TFT T3. An emission control drain electrode D6 of the emission control TFT T6 may be electrically connected to a second initialization source electrode S7 of the second initialization TFT T7 and the pixel electrode of the OLED.

The operation control TFT T5 and the emission control TFT T6 may be simultaneously turned on according to the emission control signal En received through the emission control line EL, and may cause the driving voltage ELVDD to be transmitted to the main OLED and the driving current $I_{OLED}$ to flow through the OLED.

A second initialization gate electrode G7 of the second initialization TFT T7 may be connected to the previous scan line SL-1. The second initialization source electrode S7 of the second initialization TFT T7 may be connected to the emission control drain electrode D6 of the emission control TFT T6 and the pixel electrode of the main OLED. The second initialization drain electrode D7 of the second initialization TFT T7 may be connected to the first initialization source electrode S4 of the first initialization TFT T4 and the initialization voltage line VL. The second initialization TFT T7 may be turned on according to the previous scan signal Sn-1 received through the previous scan line SL-1 and may initialize the pixel electrode of the main OLED.

Although the first initialization TFT T4 and the second initialization TFT T7 are connected to the previous scan line SL-1 in the embodiment of FIG. 6, the disclosure is not limited thereto. In other embodiments, the first initialization TFT T4 may be connected to the previous scan line SL-1 and may operate according to the previous scan signal Sn-1, and the second initialization TFT T7 may be connected to a separate signal line (for example, a next scan line) and may operate according to a signal transmitted through the signal line.

An upper electrode CE2 of the storage capacitor Cst may be connected to the driving voltage line PL. A counter electrode of the OLED may be connected to a common voltage ELVSS. Accordingly, the OLED may receive the driving current $I_{OLED}$ from the driving TFT T1 to emit light and display an image.

Although the compensation TFT T3 and the first initialization TFT T4 have dual gate electrodes in the embodiment of FIG. 6, the disclosure is not limited thereto. In other embodiments, the compensation TFT T3 and the first initialization TFT T4 may include one gate electrode.

Figure 7:
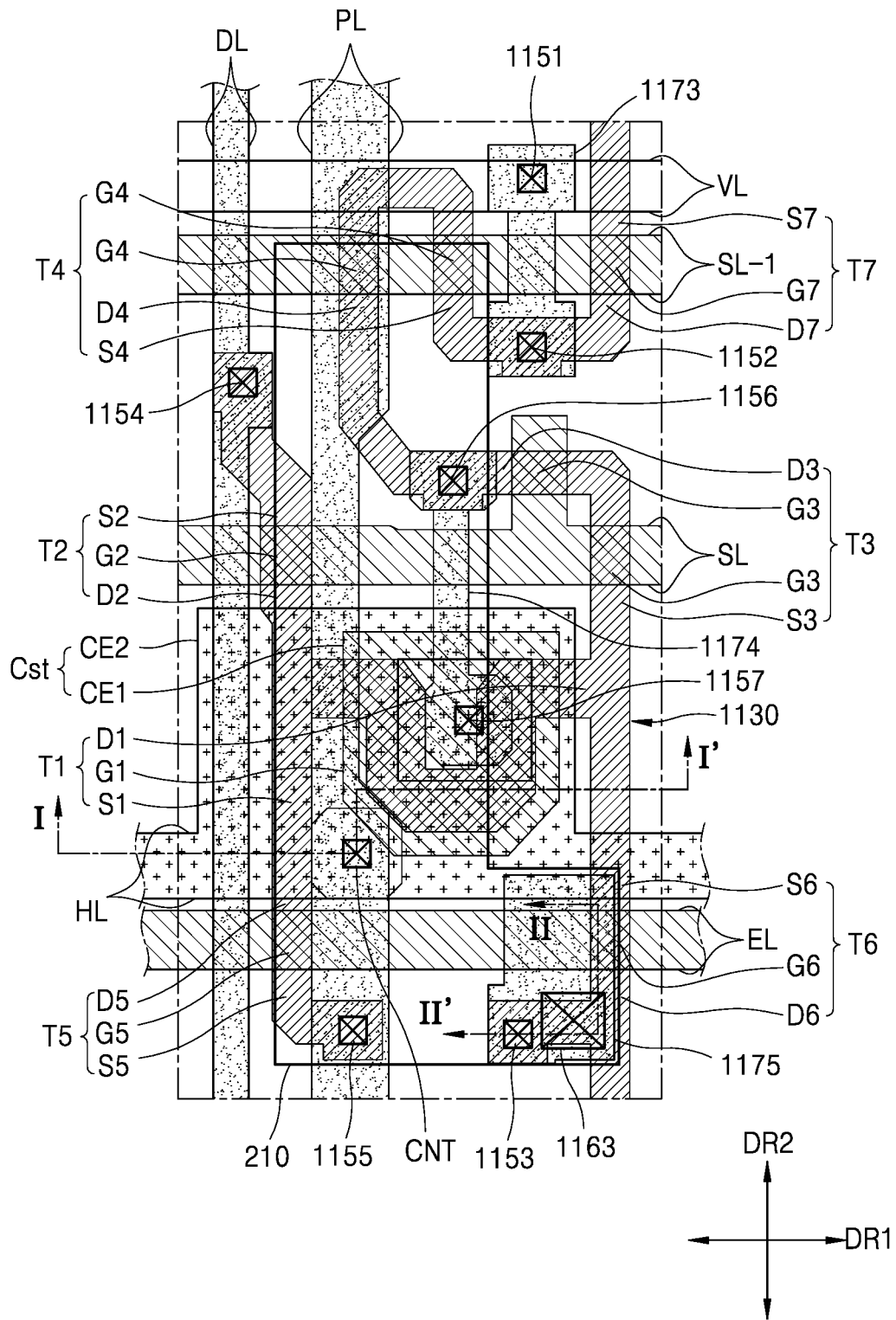
FIG. 7 is a view of a pixel circuit of a pixel according to an embodiment.
Figure 8:
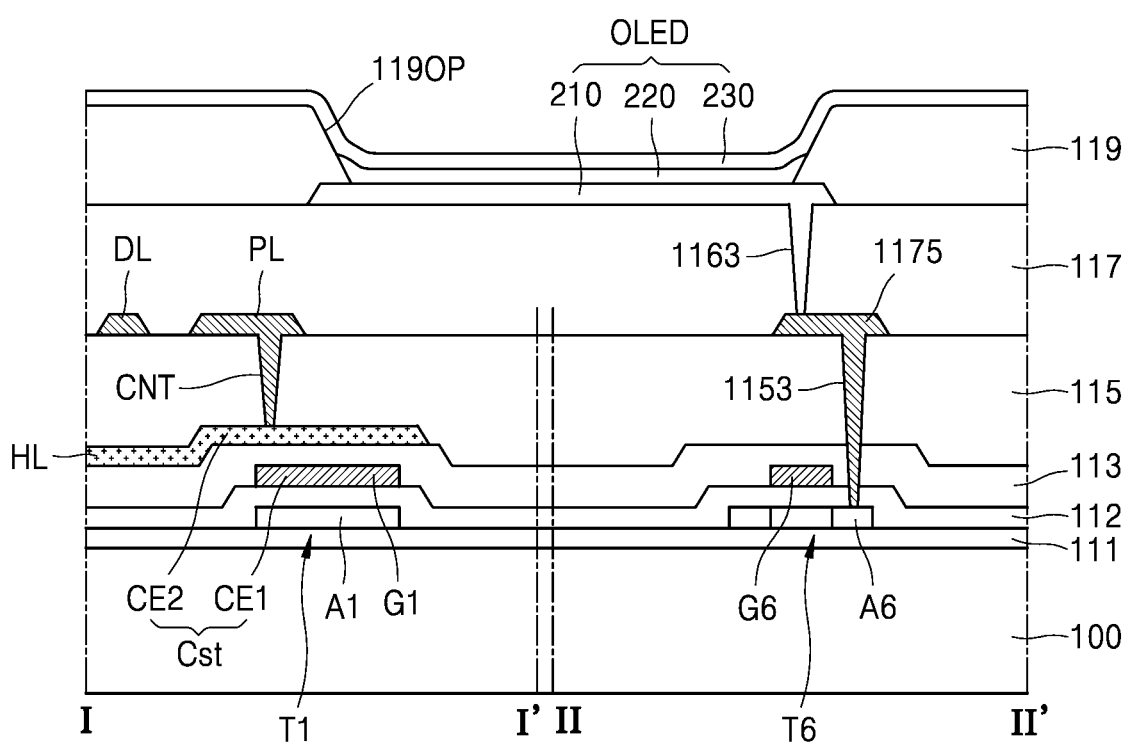
FIG. 8 is a schematic cross-sectional view taken along lines I-I' and II-II' of FIG. 7.

FIG. 7 is a view of a pixel circuit of a pixel according to an embodiment. FIG. 8 is a cross-sectional view taken along lines I-I' and II-II' of FIG. 7.

Referring to FIGS. 7 and 8, the driving TFT T1, the switching TFT T2, the compensation TFT T3, the first initialization TFT T4, the operation control TFT T5, the emission control TFT T6, and the second initialization TFT T7 may be arranged along a semiconductor layer 1130.

The semiconductor layer 1130 may be located or disposed on a substrate on which a buffer layer including an inorganic insulating material may be formed. In the embodiment, the semiconductor layer 1130 may include low-temperature polysilicon (LTPS). Because a polysilicon material has a high electron mobility (equal to or higher than about 100 $cm^2/Vs$) and has low energy consumption power and high reliability, the polysilicon material may be used as a semiconductor layer of a TFT in a display apparatus. However, the disclosure is not limited thereto, and in other embodiments, the semiconductor layer 1130 may be formed of amorphous silicon (a-S) and/or an oxide semiconductor, and some semiconductor layers from among TFTs may be formed of LTPS and some other semiconductor layers may be formed of amorphous silicon and/or an oxide semiconductor.

Some portions of the semiconductor layer 1130 may correspond to semiconductor layers of the driving TFT T1, the switching TFT T2, the compensation TFT T3, the first initialization TFT T4, the operation control TFT T5, the emission control TFT T6, and the second initialization TFT T7. In other words, the semiconductor layers of the driving TFT T1, the switching TFT T2, the compensation TFT T3, the first initialization TFT T4, the operation control TFT T5, the emission control TFT T6, and the second initialization TFT T7 may be connected to one another in various curved shapes or other shapes as may be understood and appreciated by those of ordinary skill in the art.

The semiconductor layer 1130 may include a channel region, and a source region and a drain region on both sides of the channel region. The source region and the drain region may be respectively a source electrode and a drain electrode of a corresponding TFT. For convenience of explanation, the source region and the drain region may be respectively referred to as a source electrode and a drain electrode.

The driving TFT T1 may include the driving gate electrode G1 overlapping a driving channel region, and the driving source electrode S1 and the driving drain electrode D1 on both sides of the driving channel region. The driving channel region overlapping the driving gate electrode G1 may have a curved shape such as a substantially omega shape to form a long length of the driving channel in a narrow space. When a length of the driving channel region is large, a driving range of a gate voltage may be increased and a gray level of light emitted by an OLED may be more precisely controlled, thereby improving display quality.

The switching TFT T2 may include the switching gate electrode G2 overlapping a switching channel region and the switching source electrode S2 and the switching drain electrode D2 on both sides of the switching channel region. The switching drain electrode D2 may be connected to the driving source electrode S1.

The compensation TFT T3 that may be a dual TFT may include compensation gate electrodes G3 overlapping two compensation channel regions, and may include the compensation source electrode S3 and the compensation drain electrode D3 on both sides of the compensation gate electrodes G3. The compensation TFT T3 may be connected to the driving gate electrode G1 of the driving TFT T1 through a node connection line 1174 which will be described below.

The first initialization TFT T4 that may be a dual TFT may include the first initialization gate electrodes G4 overlapping two first initialization channel regions, and may include the first initialization source electrode S4 and the first initialization drain electrode D4 on both sides of the first initialization gate electrodes G4.

The operation control TFT T5 may include the operation control gate electrode G5 overlapping an operation control channel region, and the operation control source electrode S5 and the operation control drain electrode D5 on both sides of the operation control gate electrode G5. The operation control drain electrode D5 may be connected to the driving source electrode S1.

The emission control TFT T6 may include the emission control gate electrode G6 overlapping an emission control channel region, and the emission control source electrode S6 and the emission control drain electrode D6 on both sides of the emission control gate electrode G6. The emission control source electrode S6 may be connected to the driving drain electrode D1.

The second initialization TFT T7 may include the second initialization gate electrode G7 overlapping a second initialization channel region, and the second initialization source electrode S7 and the second initialization drain electrode D7 on both sides of the second initialization gate electrode G7.

The above TFTs may be connected to the signal lines (for example, the scan line SL, a previous scan line SL-1, the emission control line EL, and the data line DL), the initialization voltage line VL, and the driving voltage line PL.

The scan line SL, the previous scan line SL-1, the emission control line EL, and the driving gate electrode G1 may be located or disposed on the semiconductor layer 1130 with insulating layer(s) therebetween.

The scan line SL may extend in the first direction DR1. Some portions of the scan line SL may correspond to the switching and compensation gate electrodes G2 and G3. For example, portions of the scan line SL overlapping channel regions of the switching and compensation TFTs T2 and T3 may be respectively the switching and compensation gate electrodes G2 and G3.

The previous scan line SL-1 may extend in the first direction DR1, and some portions of the previous scan line SL-1 may respectively correspond to the first and second initialization gate electrodes G4 and G7. For example, portions of the previous scan line SL-1 overlapping channel regions of the first and second initialization driving TFTs T4 and T7 may respectively correspond to the first and second initialization gate electrodes G4 and G7.

The emission control line EL extends in the first direction DR1. Some portions of the emission control line EL may respectively correspond to the operation control and emission control gate electrodes G5 and G6. For example, portions of the emission control line EL overlapping channel regions of the operation control and emission control TFTs T5 and T6 may be respectively the operation control and emission control gate electrodes G5 and G6.

The driving gate electrode G1 that may be a floating electrode may be connected to the compensation TFT T3 through the node connection line 1174.

An electrode voltage line HL may be located or disposed on the scan line SL, the previous scan line SL-1, the emission control line EL, and the driving gate electrode G1 with insulating layer(s) therebetween.

The electrode voltage line HL may extend in the first direction DR1 to intersect the data line DL and the driving voltage line PL. A part of the electrode voltage line HL may cover at least a part of the driving gate electrode G1 and may form the storage capacitor Cst along with the driving gate electrode G1. For example, the driving gate electrode G1 may be the lower electrode CE1 of the storage capacitor Cst, and a part of the electrode voltage line HL may be the upper electrode CE2 of the storage capacitor Cst. However, the embodiment is not limited thereto. For example, the driving gate electrode G1 may be the upper electrode CE2 of the storage capacitor Cst, and a part of the electrode voltage line HL may be the lower electrode CE1 of the storage capacitor Cst The upper electrode CE2 of the storage capacitor Cst may be electrically connected to the driving voltage line PL. In this regard, the electrode voltage line HL may be connected to the driving voltage line PL located or disposed on the electrode voltage line HL through a contact hole CNT. Accordingly, the electrode voltage line HL may have the same voltage level (or constant voltage) as that of the driving voltage line PL. For example, the electrode voltage line HL may have a constant voltage of about +5 V. The electrode voltage line HL may be a horizontal driving voltage line.

Because the driving voltage line PL extends in the second direction DR2 and the electrode voltage line HL electrically connected to the driving voltage line PL extends in the first direction DR1 that intersects the second direction DR2, driving voltage lines PL and electrode voltage lines HL may form a mesh structure in a display area.

The data line DL, the driving voltage line PL, an initialization connection line 1173, and the node connection line 1174 may be located or disposed on the electrode voltage line HL with insulating layer(s) therebetween.

The data line DL may extend in the second direction DR2 and may be connected to the switching source electrode S2 of the switching TFT T2 through a contact hole 1154. A part of the data line DL may be a switching source electrode.

The driving voltage line PL may extend in the second direction DR2 and may be connected to the electrode voltage line HL through the contact hole CNT as described above. As an example, the driving voltage line PL may be connected to the operation control TFT T5 through a contact hole 1155. The driving voltage line PL may be connected to the operation control drain electrode D5 through the contact hole 1155.

An end of the initialization connection line 1173 may be connected to the first and second initialization TFTs T4 and T7 through a contact hole 1152, and the other end of the initialization connection line 1173 may be connected to the initialization voltage line VL through a contact hole 1151 which will be described below.

An end of the node connection line 1174 may be connected to the compensation drain electrode D3 through a contact hole 1156 and the other end of the node connection line 1174 may be connected to the driving gate electrode G1 through a contact hole 1157.

The initialization voltage line VL may be located or disposed on the data line DL, the driving voltage line PL, the initialization connection line 1173, and the node connection line 1174 with insulating layer(s) therebetween.

The initialization voltage line VL may extend in the first direction DR1. The initialization voltage line VL may be connected to the first and second initialization driving TFTs T4 and T7 through the initialization connection line 1173. The initialization voltage line VL may have a constant voltage of, for example, about −2 V.

The initialization voltage line VL may be located or disposed on the same layer as a pixel electrode 210 of the OLED (see FIG. 8) and may include the same material as that of the pixel electrode 210. The pixel electrode 210 may be connected to the emission control TFT T6. The pixel electrode 210 may be connected to a connection metal 1175 through a contact hole 1163, and the connection metal 1175 may be connected to the emission control drain electrode D6 through a contact hole 1153.

Although the initialization voltage line VL is located or disposed on the same layer as the pixel electrode 210 in the embodiment of FIG. 7, in other embodiments, the initialization voltage line VL may be located or disposed on the same layer as the electrode voltage line HL.

A structure in which elements included in a display panel may be stacked according to an embodiment of the disclosure now will be described with reference to FIG. 8.

A substrate 100 may include glass or a polymer resin. The polymer resin may include polyethersulfone, polyacrylate, polyetherimide, polyethylene napthalate, polyethylene terephthalate, polyphenylene sulfide, polyarylate, polyimide, polycarbonate, cellulose acetate propionate, or a combination thereof. The substrate 100 including the polymer resin may be flexible, rollable, or bendable. The substrate 100 may have a multi-layer structure including a layer including the polymer resin and an inorganic layer (not shown).

A buffer layer 111 may be located or disposed on the substrate 100 and may reduce or prevent the penetration of foreign material, moisture, or external air from the bottom of the substrate 100 and may planarize the substrate 100. The buffer layer 111 may include an inorganic material such as oxide or nitride, an organic material, or a combination of an organic material and an inorganic material, and may have a single or multi-layer structure including an inorganic material and an organic material. A barrier layer (not shown) for preventing the penetration of external air may be further provided between the substrate 100 and the buffer layer 111.

The driving gate electrode G1 and the emission control gate electrode G6 may be located or disposed on semiconductor layers A1 and A6, respectively, with a first gate insulating layer 112 therebetween. Each of the driving gate electrode G1 and the emission control gate electrode G6 may include molybdenum (Mo), aluminum (Al), copper (Cu), titanium (Ti), and/or a combination thereof, and may have a single or multi-layer structure. For example, each of the driving gate electrode G1 and the emission control gate electrode G6 may have a single-layer structure formed of Mo. The scan line SL (see FIG. 7), the previous scan line SL-1, and the emission control line EL may be formed on the same layer as the driving gate electrode G1 and the emission control gate electrode G6. For example, the driving gate electrode G1 and the emission control gate electrode G6, the scan line SL (see FIG. 7), the previous scan line SL-1, and the emission control line EL may be located or disposed on the first gate insulating layer 112.

The first gate insulating layer 112 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof.

A second gate insulating layer 113 may be provided to cover the driving gate electrode G1 and the emission control gate electrode G6. The second gate insulating layer 113 may include $SiO_2$, SiNx, SiON, $Al_2O_3$, $TiO_2$, $Ta_2O_5$, $HfO_2$, $ZnO_2$, or a combination thereof.

The lower electrode CE1 of the storage capacitor Cst may be integrally formed with the driving gate electrode G1 of the driving TFT T1. For example, the driving gate electrode G1 of the driving TFT T1 may function as the lower electrode CE1 of the storage capacitor Cst.

The upper electrode CE2 of the storage capacitor Cst may overlap the lower electrode CE1 with the second gate insulating layer 113 therebetween. For example, the second gate insulating layer 113 may function as a dielectric layer of the storage capacitor Cst. The upper electrode CE2 may include a conductive material including Mo, Al, Cu, Ti, or a combination thereof, and may have a single or multi-layer structure including the conductive material. For example, the upper electrode CE2 may have a single-layer structure formed of Mo or a multi-layer structure formed of Mo/Al/Mo.

Although the storage capacitor Cst overlaps the driving TFT T1 in FIG. 8, the disclosure is not limited thereto. Various modifications may be made. For example, the storage capacitor Cst may not overlap the driving TFT T1.

The upper electrode CE2 may function as the electrode voltage line HL. For example, a part of the electrode voltage line HL may be the upper electrode CE2 of the storage capacitor Cst.

An interlayer insulating layer 115 may be provided to cover the upper electrode CE2. The interlayer insulating layer 115 may include $SiO_2$, SiNx, SiON, $Al_2O_3$, $TiO_2$, $Ta_2O_5$, $HfO_2$, $ZnO_2$, or combination thereof. Although the interlayer insulating layer 115 has a single-layer structure in the embodiment of FIG. 8, the interlayer insulating layer 115 may have a multi-layer structure in an embodiment.

The data line DL, the driving voltage line PL, and the connection metal 1175 may be located or disposed on the interlayer insulating layer 115. Each of the data line DL, the driving voltage line PL, and the connection metal 1175 may include a conductive material including Mo, Al, Cu, Ti, or a combination thereof, and may have a single or multi-layer structure including the conductive material. For example, each of the data line DL, the driving voltage line PL, and the connection metal 1175 may have a multi-layer structure formed of Ti/Al/Ti.

The upper electrode CE2 of the storage capacitor Cst may be connected the driving voltage line PL through the contact hole CNT defined in the interlayer insulating layer 115. Accordingly, the electrode voltage line HL may be connected to the driving voltage line PL through the contact hole CNT. Accordingly, the electrode voltage line HL may have the same voltage level (or constant voltage) as that of the driving voltage line PL.

The connection metal 1175 may be connected to the semiconductor layer A6 of the emission control TFT T6 through the contact hole 1153 that passes through the interlayer insulating layer 115, the second gate insulating layer 113, and the first gate insulating layer 112. The emission control TFT T6 may be electrically connected to the pixel electrode 210 of the OLED through the connection metal 1175.

A planarization layer 117 may be located or disposed on the data line DL, the driving voltage line PL, and the connection metal 1175, and the OLED may be located or disposed on the planarization layer 117.

The planarization layer 117 may have a substantially flat surface so that the pixel electrode 210 may be substantially flat. The planarization layer 117 may have a single or multi-layer structure formed of an organic material. The planarization layer 117 may include benzocyclobutene (BCB), PI, HMDSO, a general-purpose polymer such as PMMA or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. The planarization layer 117 may include an inorganic material. The planarization layer 117 may include $SiO_2$, SiNx, SiON, $Al_2O_3$, $TiO_2$, $Ta_2O_5$, $HfO_2$, $ZnO_2$, or a combination thereof.

When the planarization layer 117 is formed of an inorganic material, chemical mechanical polishing may be performed. The planarization layer 117 may include both an organic material and an inorganic material.

The pixel electrode 210 may be a (semi) light-transmitting electrode or a reflective electrode. In some embodiments, the pixel electrode 210 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), aluminum zinc oxide (AZO), and a combination thereof. In some embodiments, the pixel electrode 210 may have a stacked structure including ITO/Ag/ITO.

A pixel-defining layer 119 may be located or disposed on the planarization layer 117 and may have an opening 119OP through which a central portion of the pixel electrode 210 may be exposed, to define an emission area of a pixel. The pixel-defining layer 119 may increase a distance between an edge of the pixel electrode 210 and a counter electrode 230 located or disposed over the pixel electrode 210, to prevent an arc or the like from occurring on the edge of the pixel electrode 210. The pixel-defining layer 119 may be formed of an organic insulating material such as PI, polyamide, acrylic resin, BCB, HMDSO, or phenolic resin by spin coating or the like.

An intermediate layer 220 of the OLED may include an organic emission layer. The organic emission layer may include an organic material including a fluorescent or phosphorescent material that emits red, green, blue, or white light. The organic emission layer may be formed of a low molecular weight organic material or a high molecular weight organic material, and function layers such as a hole transport layer (HTL), a hole injection layer (HIL), an electron transport layer (ETL), and an electron injection layer (EIL) may be selectively located or disposed under and over the organic emission layer. The intermediate layer 220 may be located or disposed to correspond to each of the pixel electrodes 210. However, the disclosure is not limited thereto. Various modifications may be made, and for example, the intermediate layer 220 may be integrally formed over all of the pixel electrodes 210.

The counter electrode 230 may be a light-transmitting electrode or a reflective electrode. In some embodiments, the counter electrode 230 may be a transparent or semi-transparent electrode and may be formed of a metal thin film having a low work function including lithium (Li), calcium (Ca), LiF/Ca, LiF/Al, Al, Ag, Mg, or a compound thereof. A transparent conductive oxide (TCO) film, for example, ITO, IZO, ZnO, $In_2O_3$, or a combination thereof, may be located or disposed on the metal thin film.

When the pixel electrode 210 is a reflective electrode and the counter electrode 230 is a light-transmitting electrode, the display apparatus may be a top emission-type display apparatus in which light is emitted from the intermediate layer 220 to the counter electrode 230. When the pixel electrode 210 is a transparent or semi-transparent electrode and the counter electrode 230 is a reflective electrode, the display apparatus may be a bottom emission-type display apparatus in which light is emitted from the intermediate layer 220 to the substrate 100. However, the disclosure is not limited thereto. The display apparatus of the embodiment may be a dual emission-type display apparatus in which light is emitted to both a front surface and a rear surface.

In the embodiment, the counter electrode 230 may be located or disposed over an entire surface of the second display area DA2, and a part of an edge may be located or disposed in the non-display area NDA. The counter electrode 230 may be integrally formed with the main pixels PXm, for example, the OLEDs, located or disposed in the second display area DA2 to correspond to the pixel electrodes 210.

The counter electrode 230 may also be provided on the auxiliary pixels PXa located or disposed in the first display area DA1. However, because the first display area DA1 may include the auxiliary pixel area PA1 where the auxiliary pixels PXa are located or disposed and the transmission area TA, a part of the counter electrode 230 may not be provided on a portion corresponding to the transmission area TA. Although light may be emitted to the counter electrode 230 when the display apparatus is a top emission-type display apparatus, a transmittance may be partially reduced due to the counter electrode 230. Accordingly, a transmittance of the transmission area TA may be increased by not providing the counter electrode 230 in a portion corresponding to the transmission area TA.

To this end, the counter electrode 230 located or disposed in the first display area DA1 may be patterned to correspond to each auxiliary pixel area PA1. The counter electrode 230 located or disposed in the first display area DA1 may be formed by removing a portion corresponding to the transmission area TA by using laser lift-off or fine metal mask (FMM) patterning. Included in this disclosure is the embodiment where the counter electrode 230 may be formed in the first display area DA1 by using FMM mask patterning.

Figure 9:
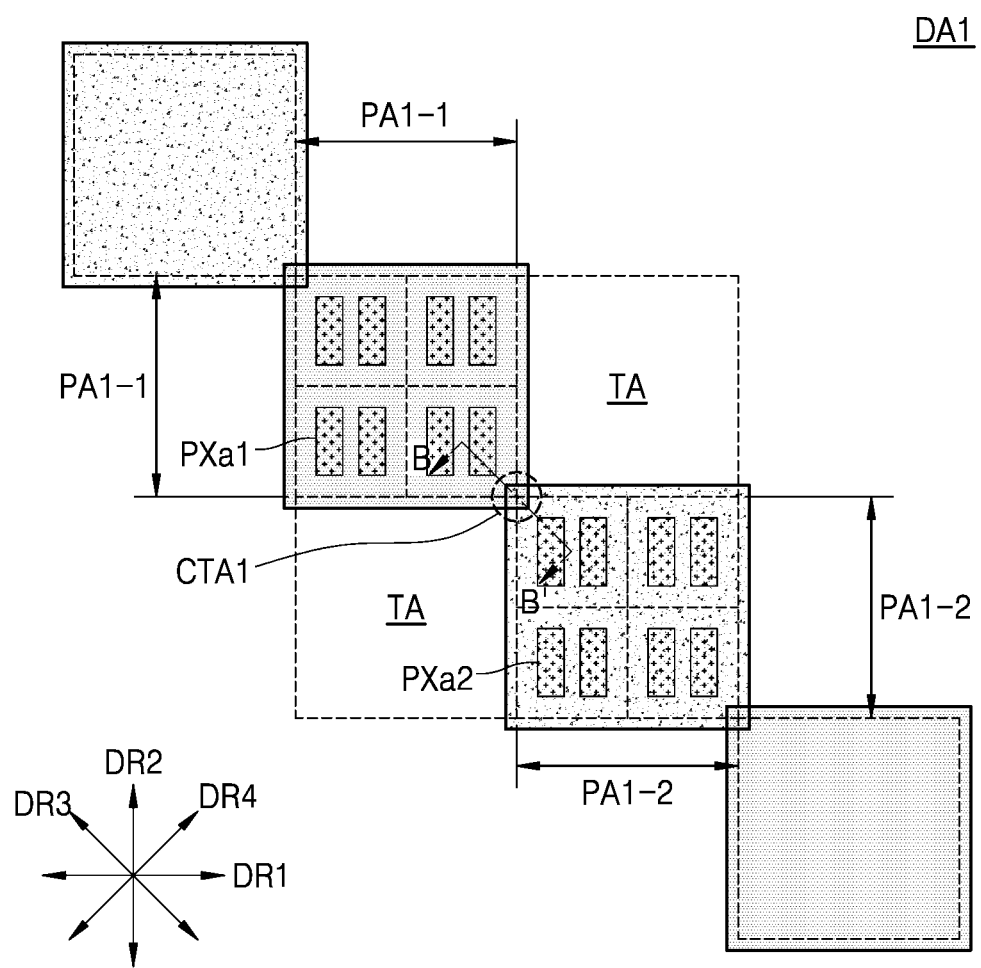
FIGS. 9 and 10 are plan views illustrating a part of a first display area according to an embodiment.
Figure 10:
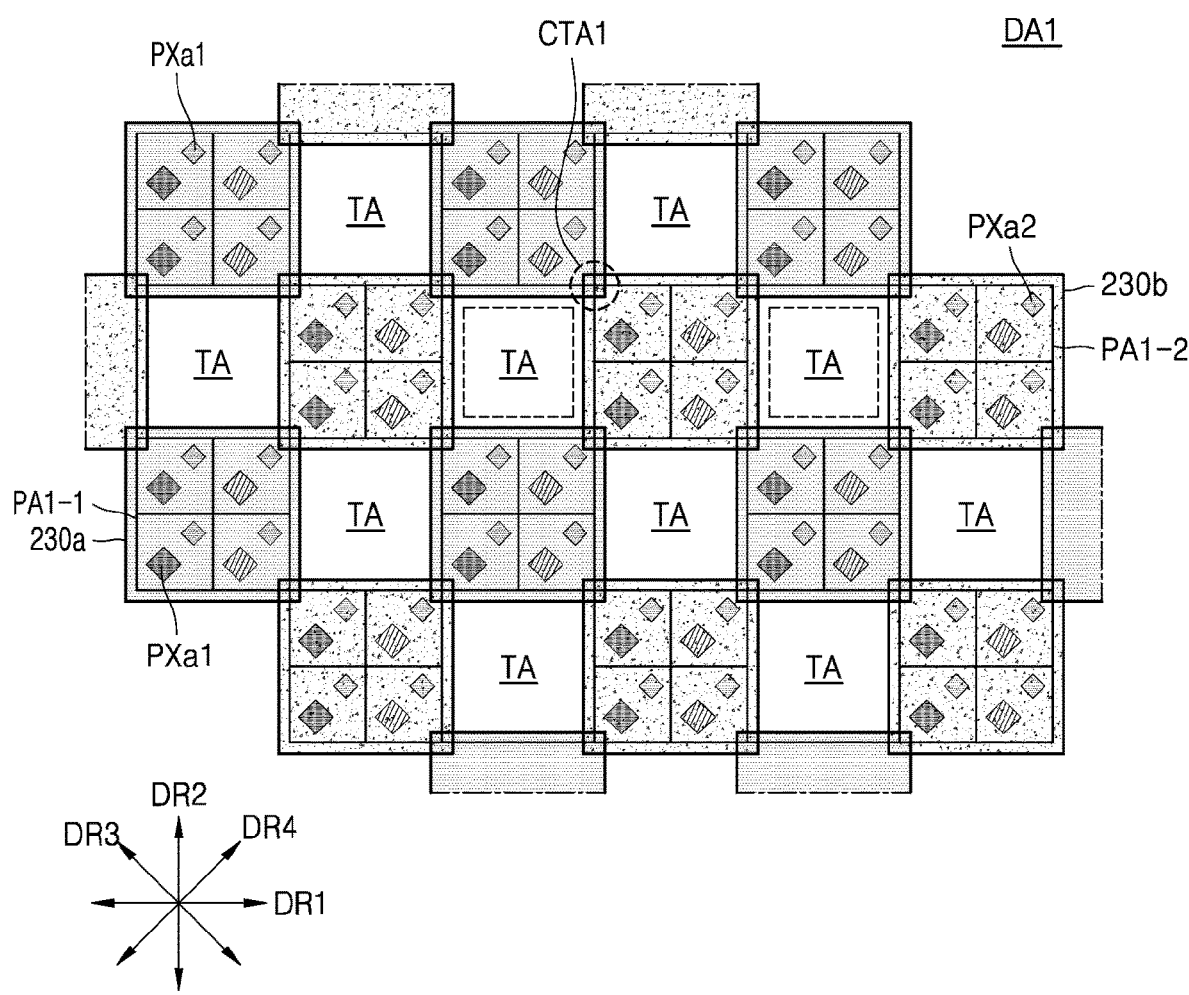

FIGS. 9 and 10 are plan views illustrating a part of a first display area according to an embodiment.

Referring to FIGS. 9 and 10, as described above, the first display area DA1 may include the auxiliary pixel area PA1 and the transmission area TA, and the auxiliary pixels PXa may be located or disposed in the auxiliary pixel area PA1. The auxiliary pixel area PA1 may include a first pixel area PA1-1 and a second pixel area PA1-2 as shown in the embodiment of FIG. 9. First pixels PXa1 may be located or disposed in the first pixel area PA1-1. Second pixels PXa2 may be located or disposed in the second pixel area PA1-2.

In the embodiment, a first counter electrode 230a may be provided in the first pixel area PA1-1, and a second counter electrode 230b may be provided in the second pixel area PA1-2. The first counter electrode 230a may be located or disposed to correspond to the first pixel area PA1-1, and the second counter electrode 230b may be located or disposed to correspond to the second pixel area PA1-2. Some portions of the first counter electrode 230a and the second counter electrode 230b may contact each other. In this case, a shape of the first counter electrode 230a and a shape of the second counter electrode 230b may be the same or similar.

Referring to FIG. 10, the first pixels PXa1 may be located or disposed in the first pixel area PA1-1. Each of the first pixels PXa1 may include a scan line that receives a scan signal and a data line that receives a data signal. The scan line may extend in the first direction DR1, and the data line DR1 may extend in the second direction DR2 that intersects, for example, orthogonally intersects, the first direction DR1. For example, other signal lines (for example, the driving voltage line PL, the emission control line EL, the previous scan line SL-1, and the initialization voltage line VL (see FIG. 7)) may be provided in the first pixel area PA1-1.

Parts of the data line and the scan line may be located or disposed in the transmission area TA. Even in this case, for example, the scan line may have a bypassing portion bypassing along an edge of the transmission area TA to increase a transmittance of the transmission area TA. The bypassing portion may also be applied to the other signal lines (for example, the driving voltage line PL, the emission control line EL, the previous scan line SL-1, and the initialization voltage line VL (see FIG. 7)).

The first pixels PXa1 located or disposed in the first pixel area PA1-1 may include the first counter electrode 230a integrally formed in one first pixel area PA1-1.

The second pixels PXa2 located or disposed in the second pixel area PA1-2 may include the second counter electrode 230b integrally formed in one second pixel area PA1-2.

The first pixel area PA1-1 and the second pixel area PA1-2 may be arranged in different lines or directions. For example, the first pixel area PA1-1 and the second pixel area PA1-2 may be arranged to surround the transmission area TA. For example, the first pixel area PA1-1 and the second pixel area PA1-2 may be arranged in a zigzag shape or other shape as may be understood and appreciated by those of ordinary skill in the art.

The first counter electrode 230a and the second counter electrode 230b may be located or disposed to respectively correspond to the first pixel area PA1-1 and the second pixel area PA1-2. Some portions of the first counter electrode 230a and the second counter electrode 230b may contact each other. The first counter electrode 230a and the second counter electrode 230b may include a first contact area CTA1 where the first counter electrode 230a and the second counter electrode 230b contact each other in the first pixel area PA1-1 and the second pixel area PA1-2 that are adjacent to each other. The first counter electrode 230a and the second counter electrode 230b may be electrically connected to each other through the first contact area CTA1.

For example, an increase in the resistance of the first and second counter electrodes 230a and 230b located or disposed in the first display area DA1 may be prevented because the first counter electrode 230a and the second counter electrode 230b are connected to each other through the first contact area CTA1.

Figure 11:
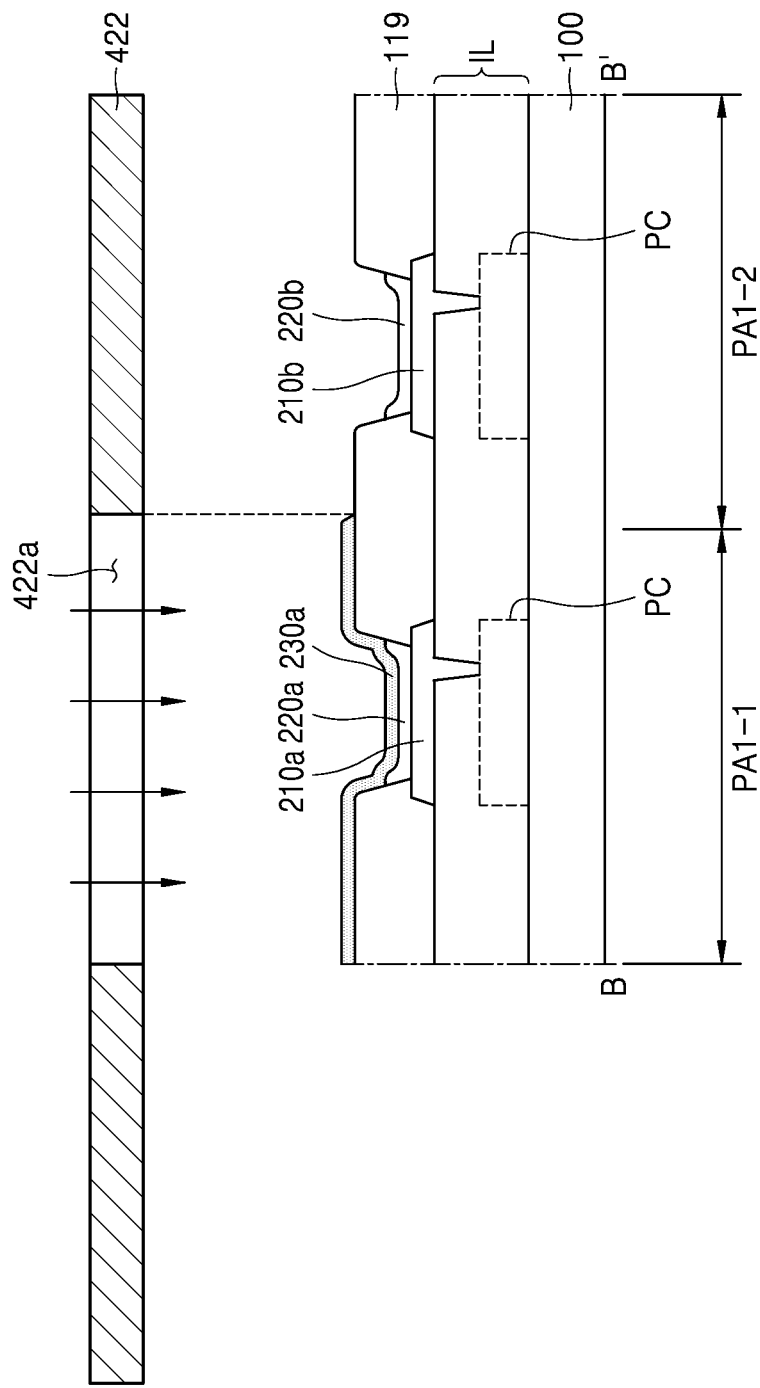
FIGS. 11 and 12 are schematic cross-sectional views illustrating a part of a process of manufacturing a display panel according to an embodiment.
Figure 12:
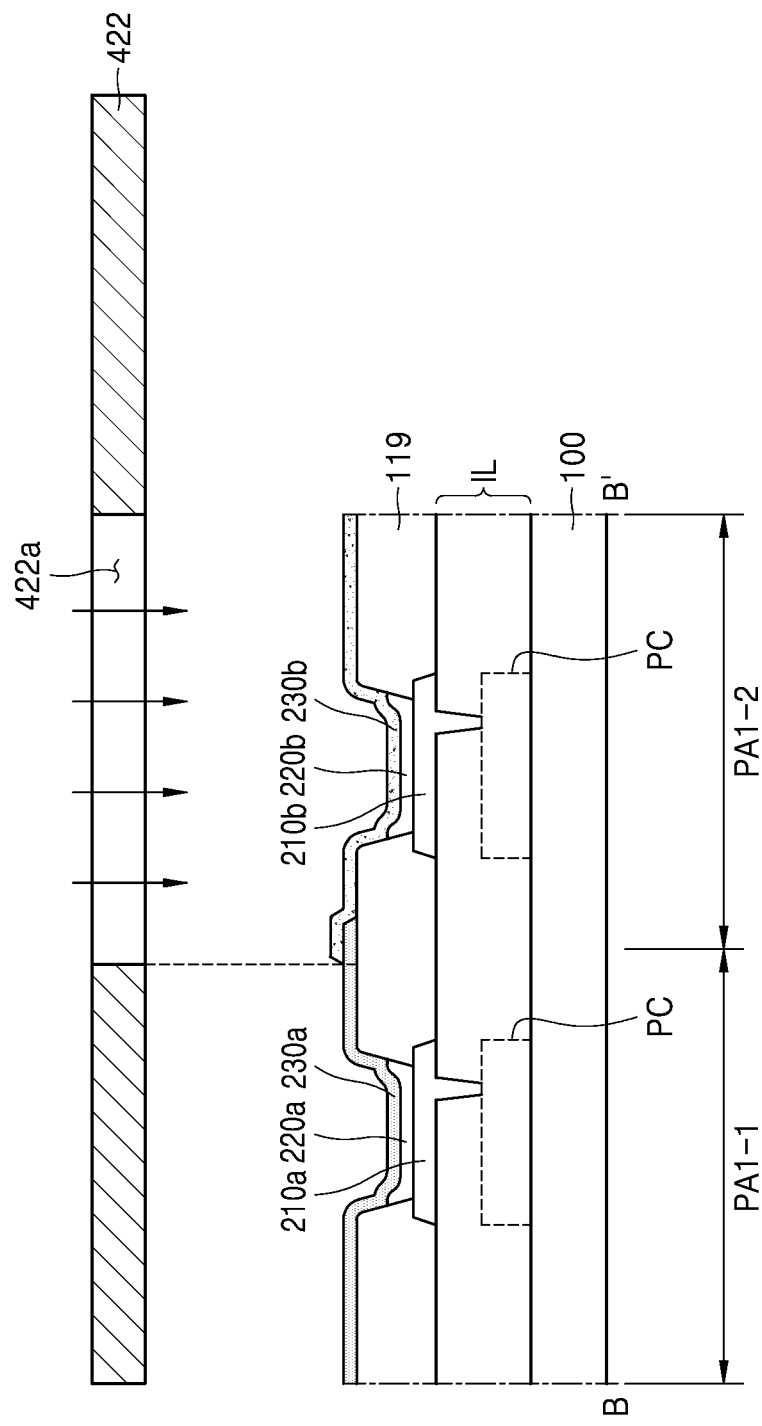
Figure 13:
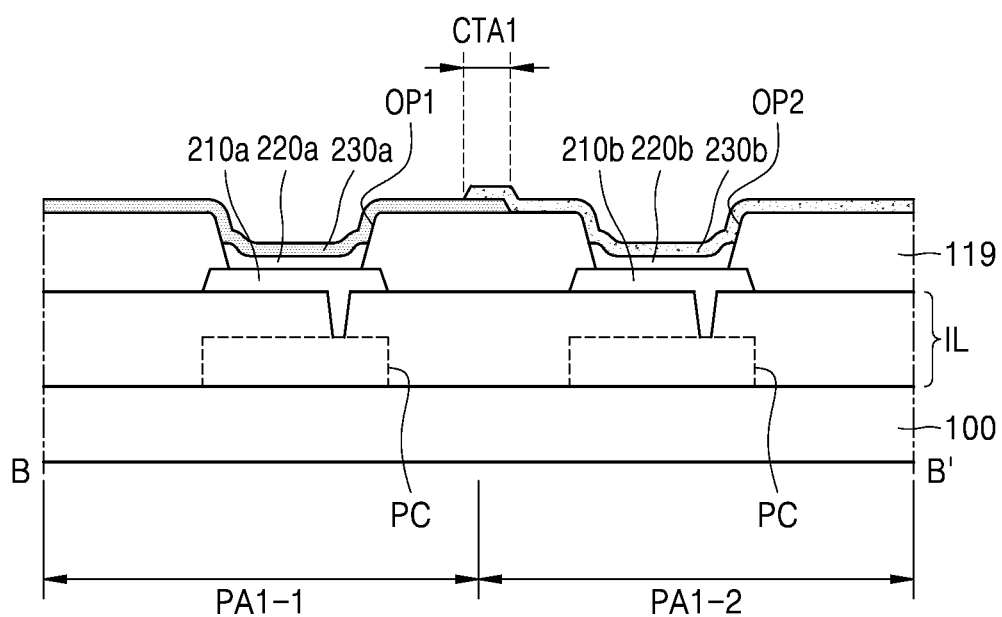
FIG. 13 is a schematic cross-sectional view taken along line B-B' of FIG. 9.

FIGS. 11 and 12 are schematic cross-sectional views illustrating a part of a process of manufacturing a display panel according to an embodiment. FIG. 13 is a schematic cross-sectional view taken along line B-B' of FIG. 9.

Referring to FIGS. 11 through 13, an insulating layer IL in which the pixel circuit PC may be located or disposed is formed on the substrate 100. A first pixel electrode 210a and a second pixel electrode 210b electrically connected to the pixel circuit PC may be formed. The first pixel electrode 210a may be located or disposed in the first pixel area PA1-1. The second pixel electrode 210b may be located or disposed in the second pixel area PA1-2.

The pixel-defining layer 119 having openings through which portions (for example, central portions) of the first pixel electrode 210a and the second pixel electrode 210b may be exposed may be formed on the first pixel electrode 210a and the second pixel electrode 210b. A first intermediate layer 220a may be formed on the first pixel electrode 210a exposed through the opening of the pixel-defining layer 119. A second intermediate layer 220b may be formed on the second pixel electrode 210b exposed through the opening of the pixel-defining layer 119. The first intermediate layer 220a and the second intermediate layer 220b may be formed of the same or similar material as that of the intermediate layer 220 of the embodiment in FIG. 8.

A first counter electrode 230a and a second counter electrode 230b may be formed on the first intermediate layer 220a and the second intermediate layer 220b, respectively. In an embodiment, the first counter electrode 230a and the second counter electrode 230b may be formed by different processes. For example, a mask sheet 422 of the same mask assembly (not shown) may be used to form the first counter electrode 230a and the second counter electrode 230b. For example, the first counter electrode 230a may be formed, and then the second counter electrode 230b may be formed on the substrate 100 by moving at least one of the mask assembly and the substrate 100 to a position different from its initial position. In another embodiment, the second counter electrode 230b may be formed, and then the first counter electrode 230a may be formed on the substrate 100 by moving at least one of the mask assembly and the substrate 100 to a position different from an initial position. For convenience of explanation, the following will be described based on that the first counter electrode 230a is formed, and then the second counter electrode 230b is formed by changing a position of the substrate 100.

As shown in FIG. 11, the first counter electrode 230a may be formed on the first intermediate layer 220a. The first counter electrode 230a may be formed by depositing a deposition material passing through a first opening 422a of a mask sheet 422 on the substrate 100. As shown in FIG. 12, the second counter electrode 230b may be formed on the second intermediate layer 220b by moving the substrate 100 leftward in FIG. 11. The second counter electrode 230b may be manufactured through the first opening 422a of the mask sheet 422.

Referring to FIG. 13, the first counter electrode 230a and the second counter electrode 230b may be in surface contact with each other in the first contact area CTA1. When the first counter electrode 230a and the second counter electrode 230b are in surface contact with each other, it may mean that no layer is located or disposed between the first counter electrode 230a and the second counter electrode 230b and the second counter electrode 230b is stacked on and contacts or directly overlaps the first counter electrode 230a.

The second counter electrode 230b may be located or disposed on the first counter electrode 230a in the first contact area CTA1. Accordingly, the second counter electrode 230b may be formed by a process subsequent to the first counter electrode 230a. In an embodiment, when the second counter electrode 230b is formed by a process subsequent to the first counter electrode 230a, in the first contact area CTA1, the second counter electrode 230b may be located or disposed on the first counter electrode 230a. Because the first counter electrode 230a and the second counter electrode 230b are in surface contact with each other in the first contact area CTA1, a thickness of the first contact area CTA1 may be about equal to or less than twice that of a region where only the first counter electrode 230a or the second counter electrode 230b is located or disposed. As an, the first contact area CTA1 is not located or not disposed in emission areas of the first pixel PXa1 and the second pixel PXa2. For example, the 'emission areas' may be formed in the pixel-defining layer 119, and may be defined as first and second openings OP1 and OP2 through which the portions (for example, central portions) of the first pixel electrode 210a and the second pixel electrode 210b are exposed. For example, the first contact area CTA1 may be provided so as not to overlap the first and second openings OP1 and OP2 formed in the pixel-defining layer 119.

As the area of the first contact area CTA1 increases, resistance of the first and second counter electrodes 230a and 230b may be more efficiently reduced. However, as described above, when the area of the first contact area CTA1 exceeds a predetermined value, the first contact area CTA1 may overlap the emission areas of the first and second pixels PXa1 and PXa2, thereby reducing the emission quality of the first and second pixels PXa1 and PXa2.

Accordingly, the first contact area CTA1 may be formed so that the area of the first contact area CTA1 does not shield the first opening OP1 and the second opening OP2.

Referring to FIGS. 11 and 13, the first pixel area PA1-1 may include a display device such as an OLED and the pixel circuit PC electrically connected to the OLED. However, the transmission area TA may not include the display device such as the OLED and the pixel circuit PC electrically connected to the OLED. The transmission area TA may be defined as an area where some of the layers located or disposed on the substrate 100 are removed or otherwise not included.

Figure 14:
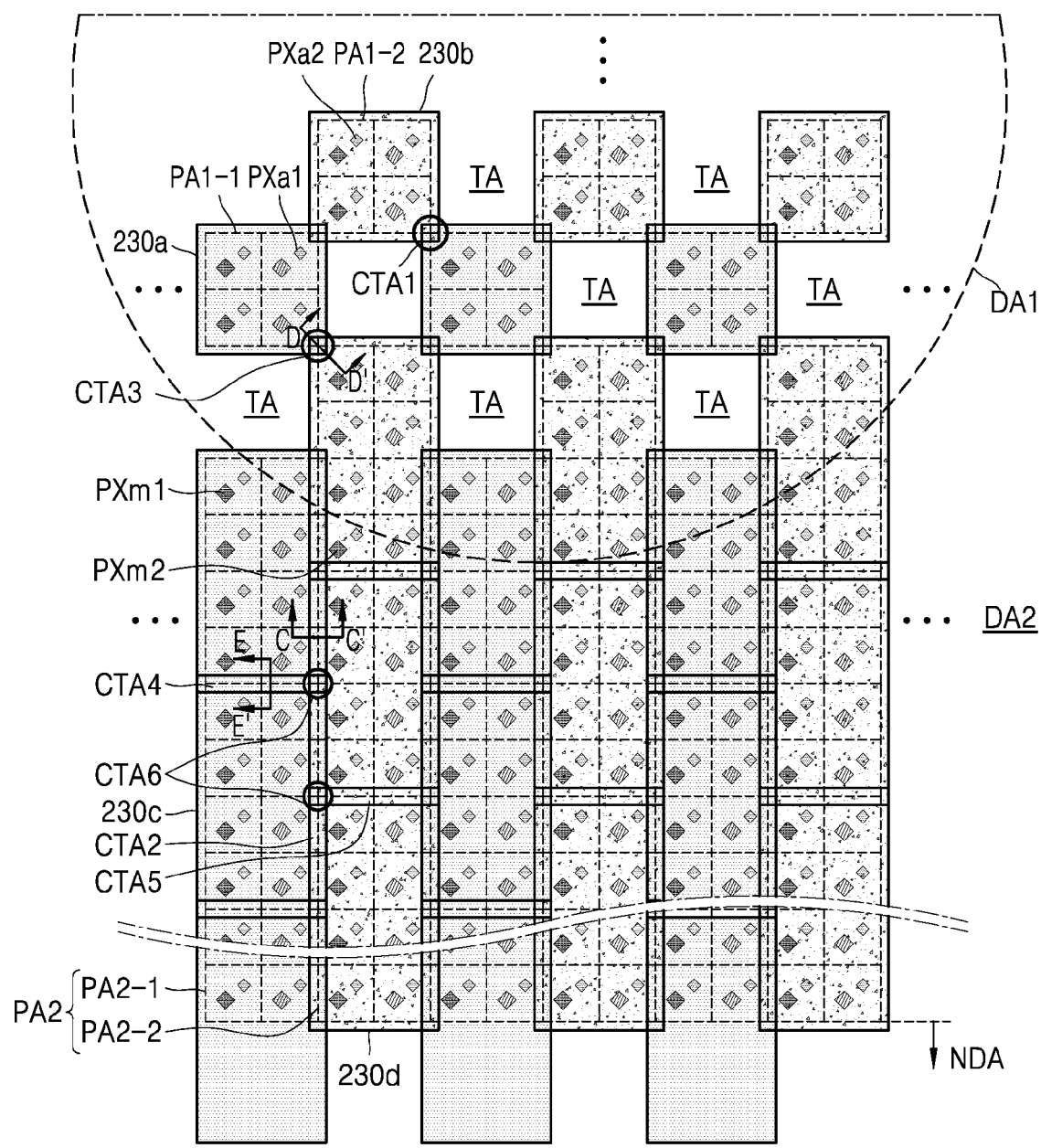
FIG. 14 is a plan view illustrating an arrangement of counter electrodes of a display panel according to an embodiment.
Figure 15:
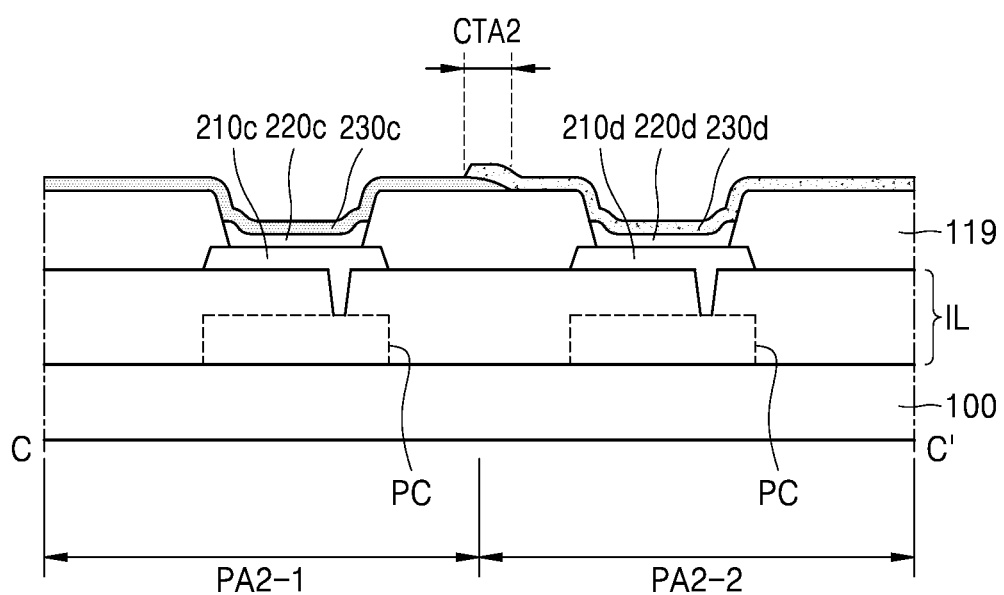
FIG. 15 is a schematic cross-sectional view taken along line C-C' of FIG. 14.
Figure 16:
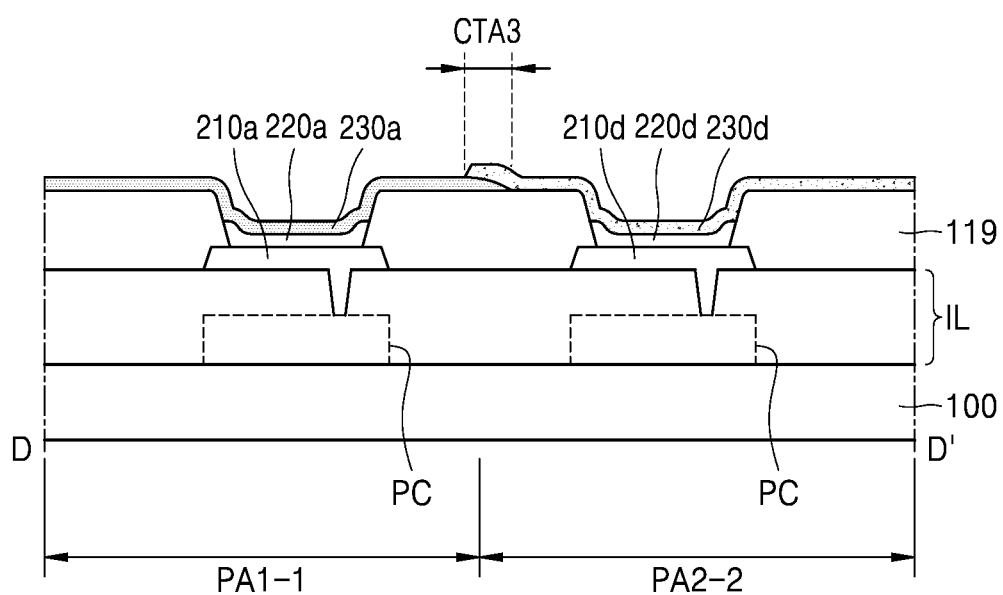
FIG. 16 is a schematic cross-sectional view taken along line D-D' of FIG. 14.
Figure 17:
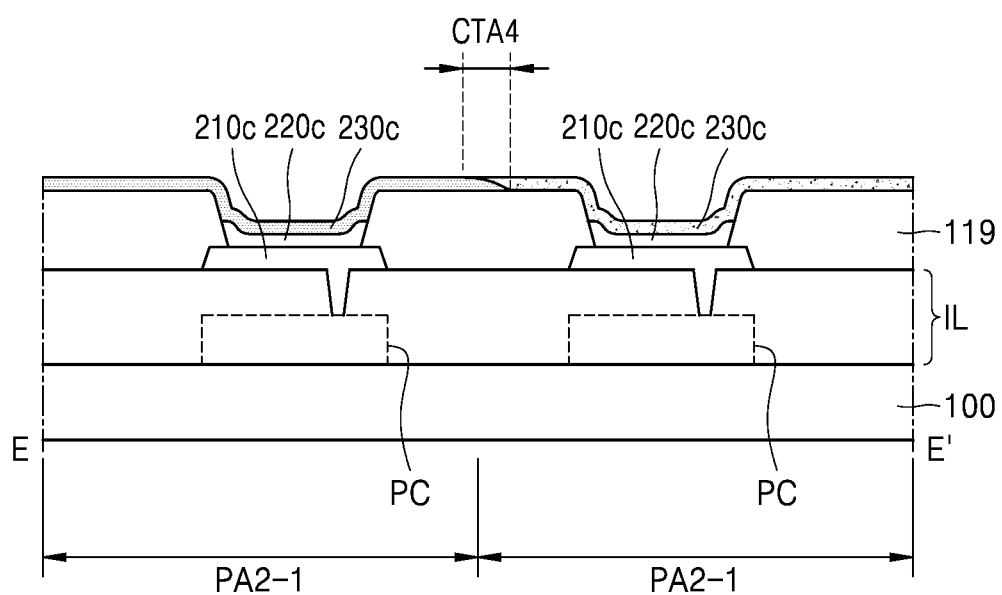
FIG. 17 is a schematic cross-sectional view taken along line E-E' of FIG. 14.

FIG. 14 is a plan view illustrating an arrangement of counter electrodes of a display panel according to an embodiment. FIG. 15 is a schematic cross-sectional view taken along line C-C' of FIG. 14. FIG. 16 is a schematic cross-sectional view taken along line D-D' of FIG. 14. FIG. 17 is a schematic cross-sectional view taken along line E-E' of FIG. 14.

Referring to FIGS. 14 through 17, the first display area DA1 may include the first pixel area PA1-1, the second pixel area PA1-2, and the transmission area TA as described above. For example, the first counter electrode 230a may be located or disposed in the first pixel area PA1-1, and the second counter electrode 230b may be located or disposed in the second pixel area PA1-2. For example, the first display area DA1 may be formed as described with reference to FIG. 1.

The second display area DA2 may include a main pixel area PA2, and the main pixel area PA2 may include a third pixel area PA2-1 and a fourth pixel area PA2-2 that may be adjacent to each other. For example, a third counter electrode 230c and a fourth counter electrode 230d may be respectively located or disposed in the third pixel area PA2-1 and the fourth pixel area PA2-2.

For example, the third counter electrode 230c and the first counter electrode 230a may be simultaneously formed, and the fourth counter electrode 230d and the second counter electrode 230b may be simultaneously formed. For example, because the third counter electrode 230c and the fourth counter electrode 230d are formed by using the same mask assembly, the third counter electrode 230c and the fourth counter electrode 230d may have the same shape.

Each of the third counter electrode 230c and the fourth counter electrode 230d may be formed in a stripe shape, and one or more third counter electrodes 230c and one or more fourth counter electrodes 230d may be provided. The shape of the counter electrodes is not limited thereto and may include an island shape or any other shape within the spirit and scope of the disclosure. When each of the third counter electrodes 230c and the fourth counter electrodes 230d is formed in a stripe shape, the third counter electrodes 230c may be aligned with the first counter electrodes 230a and the fourth counter electrodes 230d may be aligned with the second counter electrodes 230b. The third counter electrodes 230c and the fourth counter electrodes 230d may be alternately arranged in a direction different from a direction in which the first counter electrodes 230a and the third counter electrodes 230c are aligned with one another. For example, the third counter electrode 230c and the fourth counter electrode 230d that are adjacent to each other may include an overlapping portion, and the third counter electrode 230c and the fourth counter electrode 230d may be in surface contact with each other in the overlapping portion. For example, the third counter electrodes 230c and the fourth counter electrodes 230d may be connected to each other to entirely cover the second display area DA2.

In an embodiment, third counter electrodes 230c and fourth counter electrodes 230d may be provided. When the third counter electrodes 230c and the fourth counter electrodes 230d are provided, the third counter electrodes 230c may be aligned with the first counter electrodes 230a, and the fourth counter electrodes 230d may be aligned with the second counter electrodes 230b. The third counter electrodes 230c and the fourth counter electrodes 230d may be alternately arranged so that the third counter electrodes 230c and the fourth counter electrodes 230d at least partially overlap each other. For example, the third counter electrode 230c and the fourth counter electrode 230d that are adjacent to each other may be connected to each other. For example, the third counter electrodes 230c that are aligned with one another may be connected to one another in an arrangement or predetermined direction. In an embodiment, the third counter electrodes 230c may be spaced apart from one another in the arrangement or predetermined direction, and the third counter electrodes 230c that are aligned with each other and are adjacent to each other may be connected by the fourth counter electrodes 230d. For example, similar to the third counter electrodes 230c, the fourth counter electrodes 230d that are aligned with one another may be connected to one another and the fourth counter electrodes 230d that are adjacent to each other may be connected by the third counter electrodes 230c, or the fourth counter electrodes 230d that are aligned with one another may not be connected to one another and the fourth counter electrodes 230d that are adjacent to each other may be connected by the third counter electrodes 230c. For convenience of explanation, the following will be described based on that the third counter electrodes 230c and the counter electrodes 230d may be provided, and the third counter electrodes 230c that are aligned with each other and are adjacent to each other, the third counter electrodes 230c and the fourth counter electrodes 230d that are adjacent to each other, and the fourth counter electrodes 230d that are aligned with each other and are adjacent to each other may be connected to each other.

For example, a third counter electrode 230c and a fourth counter electrode 230d that are connected to each other may include a second contact area CTA2 where the third counter electrode 230c and the fourth counter electrode 230d overlap each other. For example, a thickness of the second contact area CTA2 may be greater than one of a thickness of the third counter electrode 230c and a thickness of the fourth counter electrode 230d as described above. For example, in the second contact area CTA2, one of the third counter electrodes 230c and one of the fourth counter electrodes 230d may directly contact a top surface of the other of the third counter electrode 230c and the fourth counter electrode 230d according to an order in which the third counter electrode 230c and the fourth counter electrode 230d are formed. For example, the third counter electrode 230c and the fourth counter electrode 230d may be in surface contact with each other. For convenience of explanation, the following will be described based on that the fourth counter electrode 230d may be located or disposed on the third counter electrode 230c as shown in the embodiment of FIG. 15.

A sixth contact area CTA6 may be formed in in the second contact area CTA2 within the spirit and scope of the disclosure. For example, in the sixth contact area CTA6, two third counter electrodes 230c that are aligned with each other and are adjacent to each other may be located or disposed and one or two fourth counter electrodes 230d may be located or disposed on the third counter electrodes 230c. In an embodiment, in the sixth contact area CTA6, two fourth counter electrodes 230d that are aligned with each other and overlap each other may be located or disposed, and one or two third counter electrodes 230c may be located or disposed on the fourth counter electrodes 230d. For example, all counter electrodes located or disposed in the sixth contact area CTA6 may be in surface contact with one another. A total thickness of the counter electrodes located or disposed in the sixth contact area CTA6 may be greater than a thickness of one of the third counter electrodes 230c and the fourth counter electrodes 230d.

One of the third counter electrodes 230c and the fourth counter electrodes 230d may protrude toward the first display area DA1. For example, a part of the third counter electrode 230c closest to the first display area DA1 from among the third counter electrodes 230c may protrude toward the first display area DA1 and may be located or disposed in the first display area DA1. In an embodiment, a part of the fourth counter electrode 230d closest to the first display area DA1 from among the fourth counter electrodes 230d may protrude toward the first display area DA1 and may be located or disposed in the first display area DA1. For convenience of explanation, the following will be described based on that a part of the fourth counter electrode 230d closest to the first display area DA1 from among the fourth counter electrodes 230d is located or disposed in the first display area DA1.

A part of the fourth counter electrode 230d located or disposed in the first display area DA1 may include a third contact area CTA3 overlapping the first counter electrode 230a. For example, in the third contact area CTA3, one of the first counter electrodes 230a and the fourth counter electrodes 230d may be in surface contact with the other of the first counter electrode 230a and the fourth counter electrode 230d according to a manufacturing order as shown in FIG. 16. Although not shown in FIG. 14, the second counter electrode 230b and the third counter electrode 230c may overlap each other in the third contact area CTA3, similar to the arrangement of the first counter electrode 230a and the fourth counter electrode 230d.

The third counter electrodes 230c that are aligned with each other and are adjacent to each other may form a fourth contact area CTA4 where the third counter electrodes 230c that are aligned with each other and are adjacent to each other overlap each other. The fourth counter electrodes 230d that are aligned with each other and are adjacent to each other may form a fifth contact area CTA5 where the fourth counter electrodes 230d that are aligned with each other and are adjacent to each other overlap each other. A thickness of the fourth contact area CTA4 and a thickness of the fifth contact area CTA5 may be about the same as a thickness of one of the third counter electrode 230c and the fourth counter electrode 230d. As an example, when the third counter electrodes 230c which are adjacent to each other are formed, a part of a deposition material passing through openings of a mask sheet (not shown) may be deposited on a portion of the substrate 100 located or disposed on a rear surface of the mask sheet located or disposed between the openings of the mask sheet. For example, when the deposition material is deposited on the substrate 100 located or disposed on the rear surface between the openings of the mask sheet and the third counter electrode 230c, a thickness of a portion of the third counter electrode 230c may be less than a thickness of other portions of the third counter electrode 230c. When the fourth counter electrode 230d is formed, similar to the third counter electrode 230c, a thickness of a portion of the fourth counter electrode 230d may be different from a thickness of other portions of the fourth counter electrode 230d.

Accordingly, because a thickness of each of the third counter electrodes 230c overlapping each other in the fourth contact area CTA4 is less than a thickness of other portions of the third counter electrodes 230c, a thickness when the third counter electrodes 230c overlap each other may be substantially similar to the thickness of the other portions of the third counter electrode 230c. As another example, the fifth contact area CTA5 where the fourth counter electrodes 230d overlap each other may have a structure similar to that of the fourth contact area CTA4.

At least one pixel may be located or disposed in each of the first pixel area PA1-1, the second pixel area PA1-2, the third pixel area PA2-1, and the fourth pixel area PA2-2. For example, the first pixel PXa1 may be located or disposed in the first pixel area PA1-1, and the second pixel PXa2 may be located or disposed in the second pixel area PA1-2. A third pixel PXm1 may be located or disposed in the third pixel area PA2-1, and a fourth pixel PXm2 may be located or disposed in the fourth pixel area PA2-2. For example, the third pixel PXm1 and the fourth pixel PXm2 may respectively include a third intermediate layer 220c and a fourth intermediate layer 220d as shown in FIGS. 15 through 17. The pixels may be the same as or similar to those described above. A third pixel electrode 210c and a fourth pixel electrode 210d electrically connected to the pixel circuit PC may be formed. The third pixel electrode 210c may be located or disposed in the third pixel area PA2-1. The fourth pixel electrode 210d may be located or disposed in the fourth pixel area PA2-2.

Figure 18:
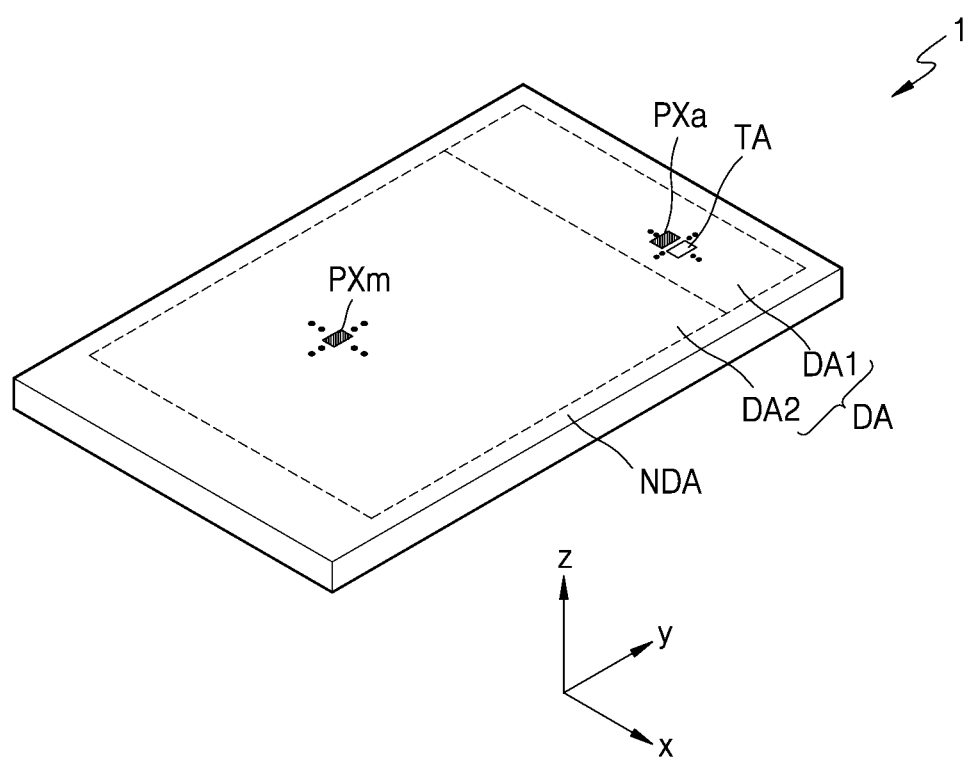
FIG. 18 is a perspective view of a display apparatus according to an embodiment.
Figure 19:
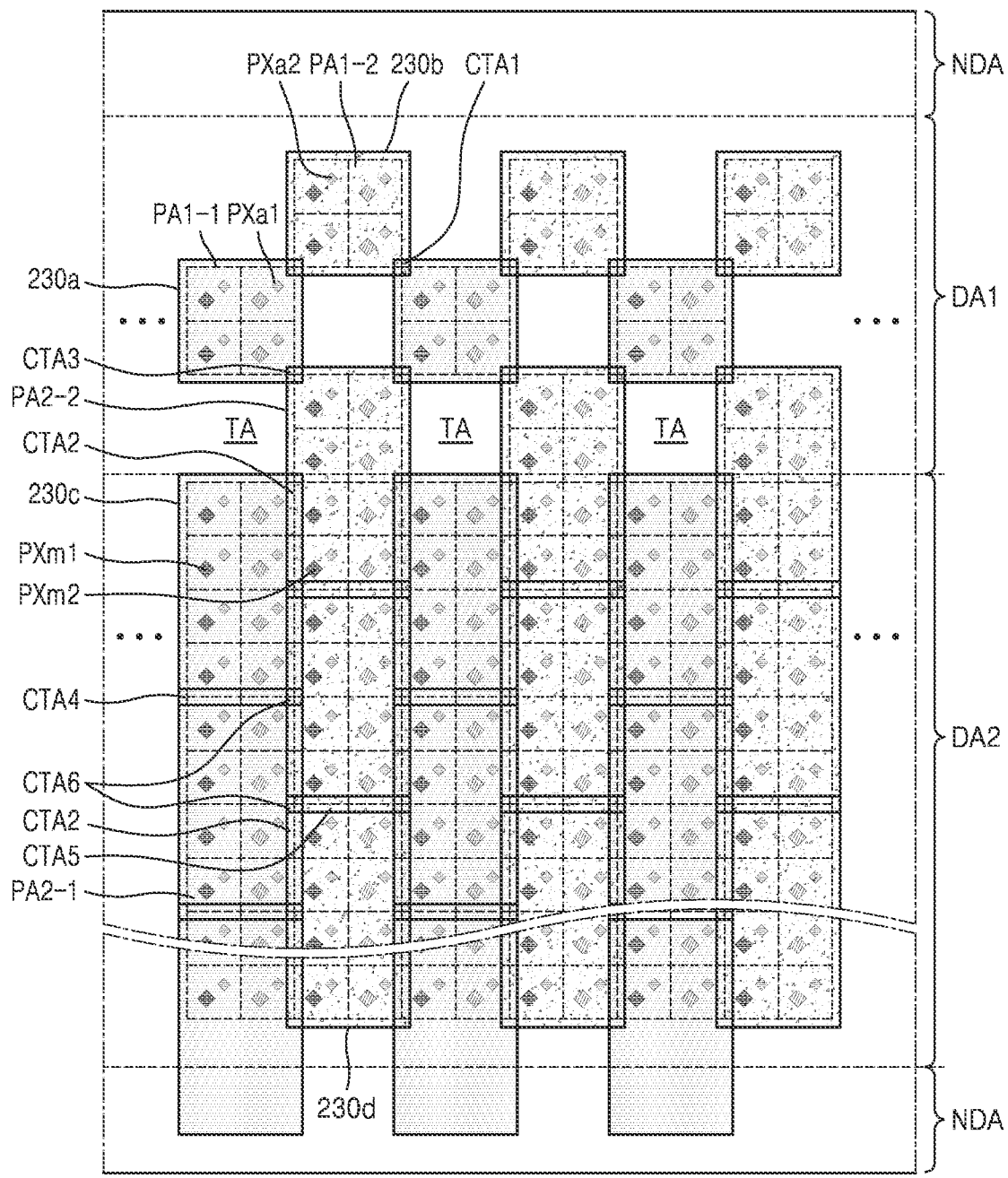
FIG. 19 is a plan view illustrating a display area and a non-display area of a display panel according to an embodiment.

FIG. 18 is a perspective view of a display apparatus according to an embodiment. FIG. 19 is a plan view illustrating a display area and a non-display area of a display panel according to an embodiment.

Referring to FIGS. 18 and 19, the display apparatus 1 may be similar to the embodiment of FIG. 1. By way of example, the display apparatus 1 may include the first display area DA1, the second display area DA2, and the non-display area NDA.

The first display area DA1 may be a separate area, or, not included in the second display area DA2, of the display apparatus 1, unlike the embodiment of FIG. 1. For example, a shape of the first display area DA1 may be similar to a shape of the second display area DA2. For example, the first display area DA1 may be longitudinally formed in an X-axis. A light transmittance of the first display area DA1 may be greater than a light transmittance of the second display area DA2, and a resolution of the first display area DA1 may be less than a resolution of the second display area DA2. For example, the first display area pixel PXa may be located or disposed in the first display area DA1, and the second display area pixel PXm may be located or disposed in the second display area DA2 as described above. The first display area DA1 may include the transmission area TA where the first display area pixel PXa is not located or disposed.

A component may be located or disposed at any of various positions in the first display area DA1. For example, at least one component may be located or disposed in the first display area DA1.

The first display area DA1 may include the first pixel area PA1-1, the second pixel area PA1-2, and the transmission area TA. For example, the first pixel areas PA1-1 and the second pixel areas PA1-2 may be alternately arranged, and the transmission area TA may be defined, for example, by the first pixel area PA1-1 and the second pixel area PA1-2 that are adjacent to each other. The transmission area TA may be shielded by or partly surrounded by the first pixel areas PA1-1 and the second pixel areas PA1-2 that are connected to each other. The first counter electrode 230a and the second counter electrode 230b may be respectively located or disposed in the first pixel area PA1-1 and the second pixel area PA1-2. The first counter electrode 230a and the second counter electrode 230b may be connected to each other by overlapping each other in the first contact area CTA1. The first pixel PXa1 and the second pixel PXa2 may be respectively located or disposed in the first pixel area PA1-1 and the second pixel area PA1-2. One of the third counter electrode 230c and the fourth counter electrode 230d may protrude in the first display area DA1. For example, one of the third counter electrode 230c and the fourth counter electrode 230d may overlap the first counter electrode 230a or the second counter electrode 230b in the first display area DA1. For convenience of explanation, the following will be described based on the configuration that the first counter electrode 230a and the fourth counter electrode 230d may overlap each other. For example, the first counter electrode 230a and the fourth counter electrode 230d may include the third contact area CTA3 where the first counter electrode 230a and the fourth counter electrode 230d overlap each other.

The second display area DA2 may include the third pixel area PA2-1 and the fourth pixel area PA2-2. For example, the third pixel area PA2-1 and the fourth pixel area PA2-2 may be alternately arranged and may have substantially the same shape or similar shape. The third counter electrode 230c and the fourth counter electrode 230d may be respectively located or disposed in the third pixel area PA2-1 and the fourth pixel area PA2-2. The third pixel PXm1 and the fourth pixel PXm2 may be respectively located or disposed in the third pixel area PA2-1 and the fourth pixel area PA2-2.

The first counter electrode 230a located or disposed in the first display area DA1 and the third counter electrode 230c located or disposed in the second display area DA2 may be aligned with each other, and the second counter electrode 230b and the fourth counter electrode 230d may be aligned with each other. For example, the first counter electrode 230a and the third counter electrode 230c may be arranged to form one line, and the second counter electrode 230b and the fourth counter electrode 230d may be arranged to form one line.

The third counter electrodes 230c may be provided, and the third counter electrodes 230c that are aligned with one another may at least partially overlap one another. The fourth counter electrodes 230d may be provided, and the fourth counter electrodes 230d that are aligned with one another may at least partially overlap one another. The third counter electrode 230c and the fourth counter electrode 230d that are adjacent to each other may at least partially overlap each other. For example, the third counter electrode 230c and the fourth counter electrode 230d that overlap each other may include the second contact area CTA2, and the third counter electrodes 230c that overlap each other may include the fourth contact area CTA4, and the fourth counter electrodes 230d that overlap each other may include the fifth contact area CTA5. The sixth contact area CTA6 where the third counter electrode 360c and the fourth counter electrode 230*d* overlap each other may be located or disposed on at least one of the fourth contact area CTA4 and the fifth contact area CTA5.

The first contact area CTA1 through the sixth contact area CTA6 are the same as or similar to those described with reference to FIGS. 9 through 17, and thus a detailed explanation thereof will not be given.

When the first counter electrode 230*a* through the fourth counter electrode 230*d* are located or disposed, the first counter electrode 230*a* and the fourth counter electrode 230*d* may be connected to each other. For example, as described above, the transmission area TA may be located or disposed between the first counter electrode 230*a* and the second counter electrode 230*b*, and light generated by the component located or disposed in the first display area DA1 or light incident on the component may not be blocked.

In a contact area where counter electrodes overlap each other, the counter electrodes overlapping each other are in surface contact with each other, such that the resistance of the counter electrodes may be reduced, thereby enabling the display apparatus 1 to stably operate.

Figure 20:
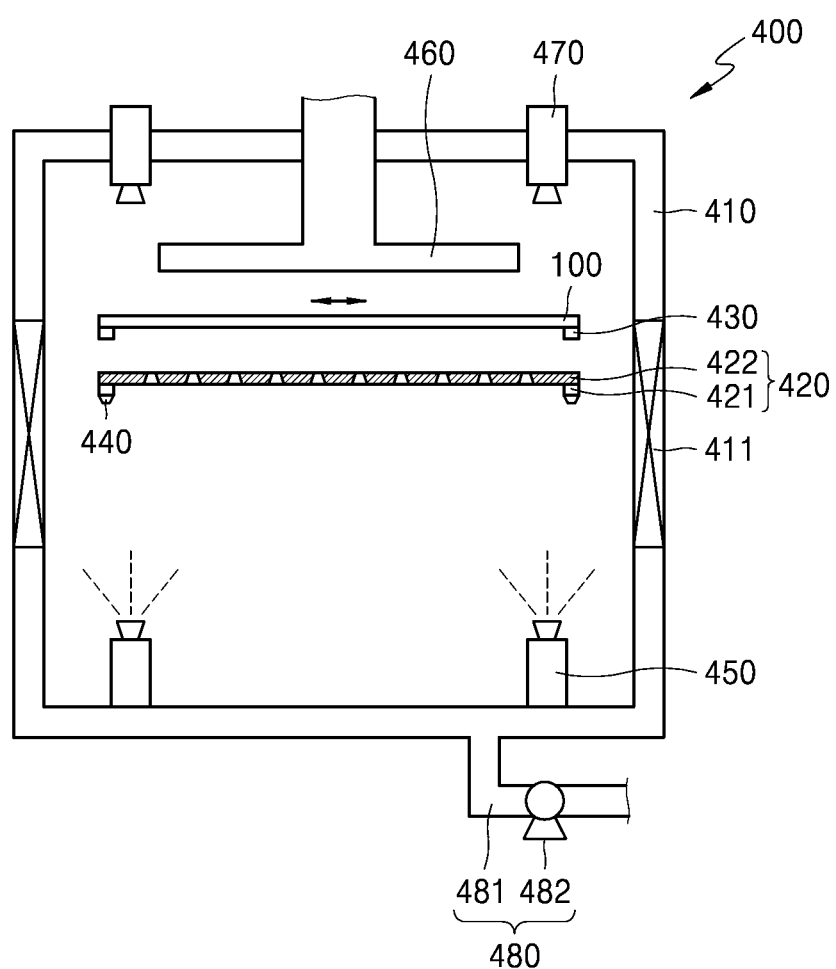
FIG. 20 is a schematic cross-sectional view of an apparatus for manufacturing a display apparatus according to an embodiment.
Figure 21:
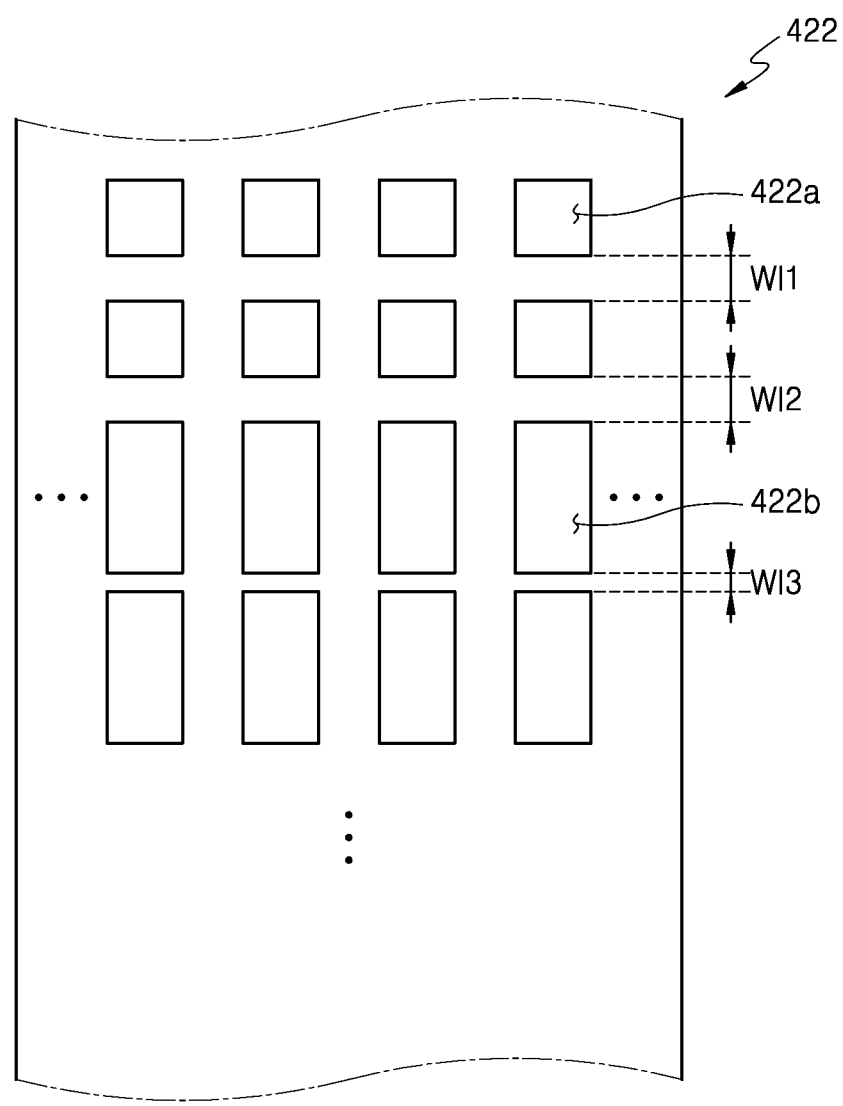
FIG. 21 is a plan view illustrating a part of a mask sheet according to an embodiment.

FIG. 20 is a schematic cross-sectional view of an apparatus for manufacturing a display apparatus according to an embodiment. FIG. 21 is a plan view illustrating a part of a mask sheet according to an embodiment.

Referring to FIGS. 20 and 21, an apparatus 400 for manufacturing a display apparatus may manufacture a display panel of a display apparatus, for example, such as the display apparatus 1 described above.

The apparatus 400 may include a chamber 410, a mask assembly 420, a first support 430, a second support 440, a deposition source 450, a magnetic force generator 460, a vision unit 470, and a pressure regulator 480.

The chamber 410 may have an inner space, and the chamber 410 may be formed so that a portion of the chamber 410 is open. In this case, a gate valve 411 may be located or disposed in the open portion of the chamber 410 to be opened/closed.

The mask assembly 420 may be selectively located or disposed inside the chamber 410. For example, the mask assembly 420 may include a mask frame 421 and a mask sheet 422. The mask frame 421 may be formed by connecting frames, and may include an opening formed inside the mask frame 421. For example, the mask frame 421 may include one opening, or openings that are separated from one another. For example, the mask frame 421 may be formed in a lattice shape such as a window frame shape. The mask sheet 422 may be elongated and may be fixed to the mask frame 421. For example, the mask sheet 422 may include an opening through which a deposition material passes.

The mask sheet 422 may include a first opening 422*a* through which a deposition material passes to form a first counter electrode 230*a* (not shown) or a second counter electrode 230*b* (not shown). The mask sheet 422 may include a second opening 422*b* for forming a third counter electrode 230*c* (not shown) or a fourth counter electrode 230*d* (not shown). However, the embodiment is not limited thereto. The first and second openings 422*a* and 422*b* of the mask sheet 422 may form any one of the first through fourth counter electrodes 230*a*, 230*b*, 230*c*, and 230*d*. Each of the first opening 422*a* and the second opening 422*b* may have any of various shapes. For example, a shape of the first opening 422*a* and a shape of the second opening 422*b* may be the same. In an embodiment, a shape of the first opening 422*a* and a shape of the second opening 422*b* may be different from each other. For convenience of explanation, the following will be described where the shape of the first opening 422*a* and a shape of the second opening 422*b* are different from each other.

The first opening 422*a* may be formed so that a shape of the first opening 422*a* corresponds to the first pixel area PA1-1 or the second pixel area PA1-2. Examples of a shape of the first opening 422*a* may include a substantially rectangular shape, a substantially square shape, and a diamond shape. For example, a deposition material passing through the first opening 422*a* may be deposited on the substrate 100 to form the first counter electrode 230*a* or the second counter electrode 230*b*. In this case, when the first openings 422*a* are provided, the first openings 422*a* may be sufficiently spaced apart from one another so as not to be connected to one another after the deposition material passing through the first openings 422*a* is deposited on the substrate 100.

The second opening 422*b* may be formed so that a shape of the second opening 422*b* is different from a shape of the first opening 422*a*. For example, a size of the second opening 422*b* may be greater than a size of the first opening 422*a*. A second distance WI2 between the first opening 422*a* and the second opening 422*b* that are adjacent to each other may be the about the same as a first distance WI1 between the first openings 422*a* that are adjacent to each other. However, a third distance WI3 between the second openings 422*b* that are adjacent to each other may be different from the first distance WI1 and the second distance WI2. For example, the third distance WI3 may be less than the first distance WI1 and the second distance WI2. For example, the third distance WI3 may be sufficiently small so that deposition materials passing through the second openings 422*b* that are adjacent to each other overlap each other and are deposited on the substrate 100. For example, deposition materials passing through the second openings 422*b* may form, on the substrate, the third counter electrodes 230*c* that are aligned with one another and are connected to one another or the fourth counter electrodes 230*d* that are aligned with one another and are connected to one another.

The substrate 100 may be seated on the first support 430. For example, the first support 430 may adjust a position of the substrate 100. For example, the first support 430 may include a UVW stage.

The mask assembly 420 may be seated on the second support 440. For example, the second support 440 may adjust a position of the mask assembly 420, similar to the first support 430.

The deposition source 450 may receive a deposition material, and may supply the deposition material to the chamber 410 by vaporizing or subliming the deposition material. For example, the deposition source 450 may include a heater inside the deposition source 450, and the deposition source 450 may melt or sublime the deposition material by heating the deposition material inside the deposition source 450 by using the heater. For example, the deposition source 450 may be located or disposed at the center or on an edge portion of the chamber 410. For convenience of explanation, the following will be described based on that the deposition source 450 may be located or disposed on the edge portion of the chamber 410.

The magnetic force generator 460 may be located or disposed in the chamber 410 and may attach the substrate 100 and the mask assembly 420. For example, the magnetic force generator 460 may include an electromagnet or a permanent magnet that generates a magnetic force.

The vision unit 470 may be located or disposed at the chamber 410 and may capture images of positions of the mask assembly 420 and the substrate 100. For example, the vision unit 470 may capture an image of an alignment mark of at least one of the mask assembly 420 and the substrate 100. The vision unit 470 may be any device or apparatus that captures an image, and may be, for example, a camera.

The pressure regulator 480 may be connected to the chamber 410 and may regulate a pressure inside the chamber 410. For example, the pressure regulator 480 may include a connection pipe 481 connected to the chamber 410 and a pump 482 located or disposed on the connection pipe 481.

The display apparatus 1 may be manufactured by using the apparatus of 400. In this case, the apparatus 400 may manufacture the display apparatus 1 according to the following embodiments as well as the above embodiments. However, for convenience of explanation, the following will be described based on that a pixel area of the display panel (not shown) of FIG. 19 may be manufactured by the apparatus 400. The same reference numerals as those of FIG. 19 denote the same members.

The substrate 100 on which an insulating layer (not shown) is formed and the mask assembly 420 may be located or disposed inside the chamber 410. In this case, a TFT (not shown), a pixel electrode (not shown) of an OLED (not shown), and an organic emission layer (not shown) may be formed.

The substrate 100 and the mask assembly 420 may be respectively seated on the first support 430 and the second support 440 and images of the substrate 100 and the mask assembly 420 may be captured by the vision unit 470. The substrate 100 and the mask assembly 420 may be aligned with each other.

When the deposition source 450 operates to supply a deposition material, the deposition material may pass through the first opening 422a and the second opening 422b of the mask sheet 422 and may be deposited on an organic emission layer and a pixel-defining layer of the substrate 100. For example, the deposition material passing through the first opening 422a may be used to form the first counter electrode 230a and the deposition material passing through the second opening 422b may be used to form the third counter electrode 230c and the fourth contact area CTA4 as described above.

For example, the first counter electrode 230a and the third counter electrode 230c may be aligned with each other. The first counter electrodes 230a and the third counter electrodes 230c may be provided to be spaced apart from one another.

When the above process is completed, a position of at least one of the substrate 100 and the mask assembly 420 may be changed. For example, after a position of the mask assembly 420 is fixed, a position of the substrate 100 may be changed. In an embodiment, after a position of the substrate 100 is fixed, a position of the mask assembly 420 may be changed. In an embodiment, both a position of the substrate 100 and a position of the mask assembly 420 may be changed. For convenience of explanation, the following will be described based on that a position of the mask assembly 420 may be fixed and a position of the substrate 100 may be changed.

When a position of the substrate 100 is changed, the first opening 422a and the second opening 422b may be located or disposed to correspond to portions of the substrate 100 where the first counter electrode 230a and the third counter electrode 230c are not formed. For example, the first opening 422a may be located or disposed between the first counter electrodes 230a that are adjacent to each other, and the second opening 422b may be located or disposed between the third counter electrodes 230c that are adjacent to each other.

When a position of the substrate 100 is changed and then a deposition material is supplied by the deposition source 450, the deposition material may pass through the first opening 422a and the second opening 422b and may be deposited on the substrate 100. For example, the deposition material passing through the first opening 422a may be deposited on the substrate 100 to form the second counter electrode 230b, and the deposition material passing through the second opening 422b may be deposited on the substrate 100 to form the fourth counter electrode 230d. When the fourth counter electrode 230d is formed, the second contact area CTA2, the fifth contact area CTA5, and the sixth contact area CTA6 may be formed. By way of example, the second counter electrode 230b may be located or disposed between the first counter electrodes 230a and may be connected through the first contact area CTA1. The fourth counter electrode 230d may be located or disposed between the second counter electrodes 230b, and the fourth counter electrode 230d may be connected to the first counter electrode 230a through the third contact area CTA3 and may be connected to the third counter electrode 230c through the second contact area CTA2 and the sixth contact area CTA6.

At least one of the third counter electrode 230c and the fourth counter electrode 230d may protrude from an edge of the second display area DA2 toward the non-display area NDA. For example, the third counter electrode 230c and the fourth counter electrode 230d may be connected to each other in the second display area DA2 to cover the second display area DA2.

Accordingly, counter electrodes located or disposed on the substrate 100 may be connected to one another through contact areas.

Figure 22:
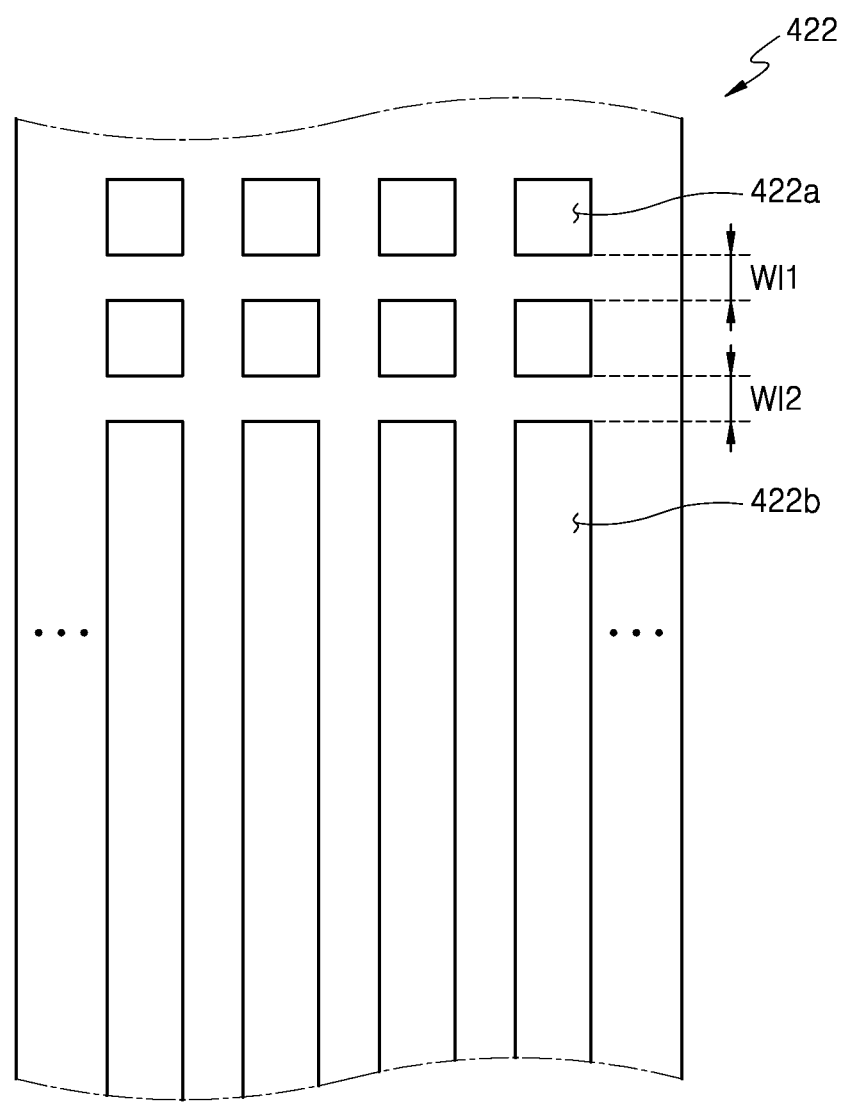
FIG. 22 is a plan view illustrating a part of a mask sheet according to an embodiment.
Figure 23:
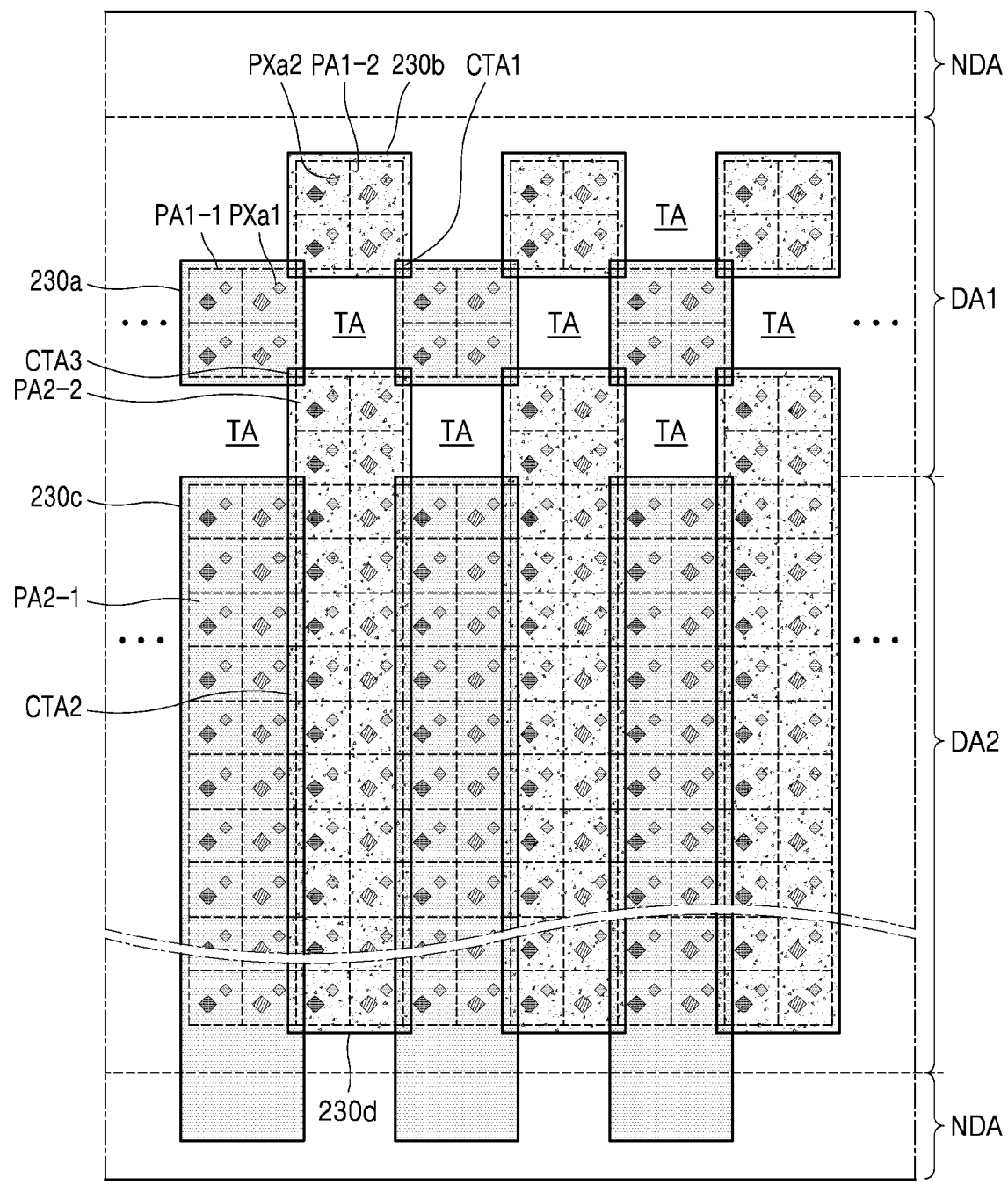
FIG. 23 is a plan view illustrating a display area and a non-display area of a display panel according to an embodiment.

FIG. 22 is a plan view illustrating a part of a mask sheet according to an embodiment. FIG. 23 is a plan view illustrating a display area and a non-display area of a display panel according to an embodiment.

Referring to FIGS. 22 and 23, an apparatus for manufacturing a display apparatus which is similar to or different from the embodiment of FIG. 20 may be applicable to the following description.

The mask sheet 422 may include the first opening 422a and the second opening 422b. For example, the first opening 422a may have a substantially square shape, and the second opening 422b may have a substantially rectangular shape. For example, the second opening 422b may be longitudinally formed in a longitudinal direction of the mask sheet 422. By way of example, the second opening 422b may be formed so that the third counter electrode 230c covers the second display area DA2 of the substrate 100.

A method of forming a counter electrode by using the apparatus for manufacturing the display apparatus may be similar to that described with reference to FIGS. 20 and 21. The first counter electrode 230a may be formed in the first display area DA1, and the third counter electrode 230c may be formed in the second display area DA2. The third counter electrode 230c may be formed at the same time as the first counter electrode 230a is formed. For example, at least a part of the third counter electrode 230c may protrude from the second display area DA2 toward the non-display area NDA. At least a part of the third counter electrode 230c may protrude from the second display area DA2 toward the first display area DA1.

The second counter electrode 230b and the fourth counter electrode 230d may be formed by changing a position of the substrate (not shown). For example, a part of the second counter electrode 230b may overlap the first counter electrode 230a, and another part of the second counter electrode 230b may overlap the third counter electrode 230c. For example, the first contact area CTA1 and the third contact area CTA3 may be respectively formed in overlapping portions. A part of the fourth counter electrode 230d may overlap the third counter electrode 230c, and the fourth counter electrode 230d and the third counter electrode 230c may overlap each other to form the second contact area CTA2. For example, a part of the fourth counter electrode 230d may protrude from the second display area DA2 toward the non-display area NDA.

Accordingly, counter electrodes located or disposed in each display area may be connected to one another. By way of example, all counter electrodes located or disposed on the substrate 100 may be connected to one another. The surface resistance of the counter electrodes may be minimized because the connected counter electrodes are in surface contact with one another.

Because the display apparatus 1 secures the transmission area TA, the function of a component located or disposed in the first display area DA1 may not be deteriorated.

Figure 24:
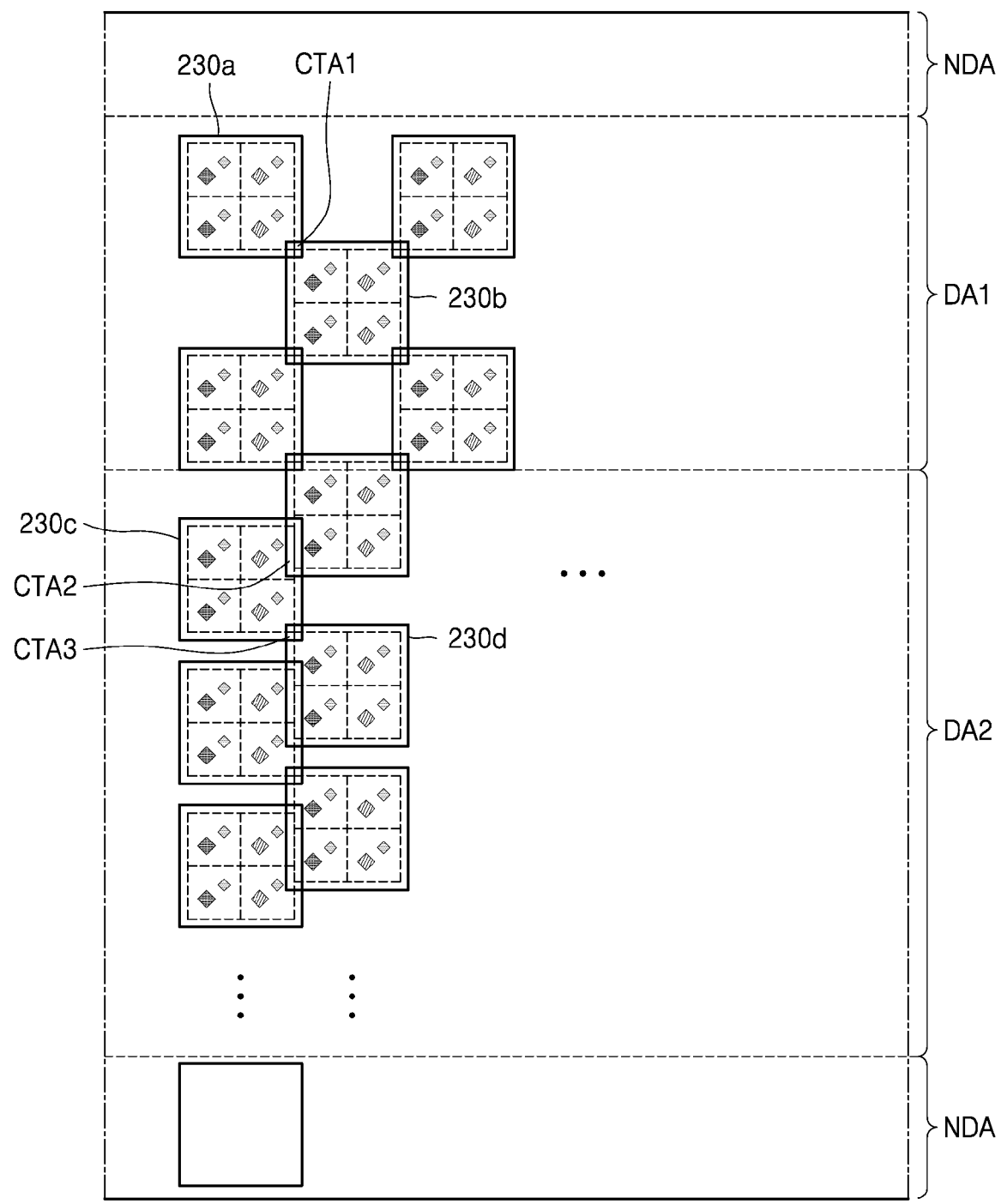
FIG. 24 is a plan view illustrating a display area and a non-display area of a display panel according to an embodiment.
Figure 25:
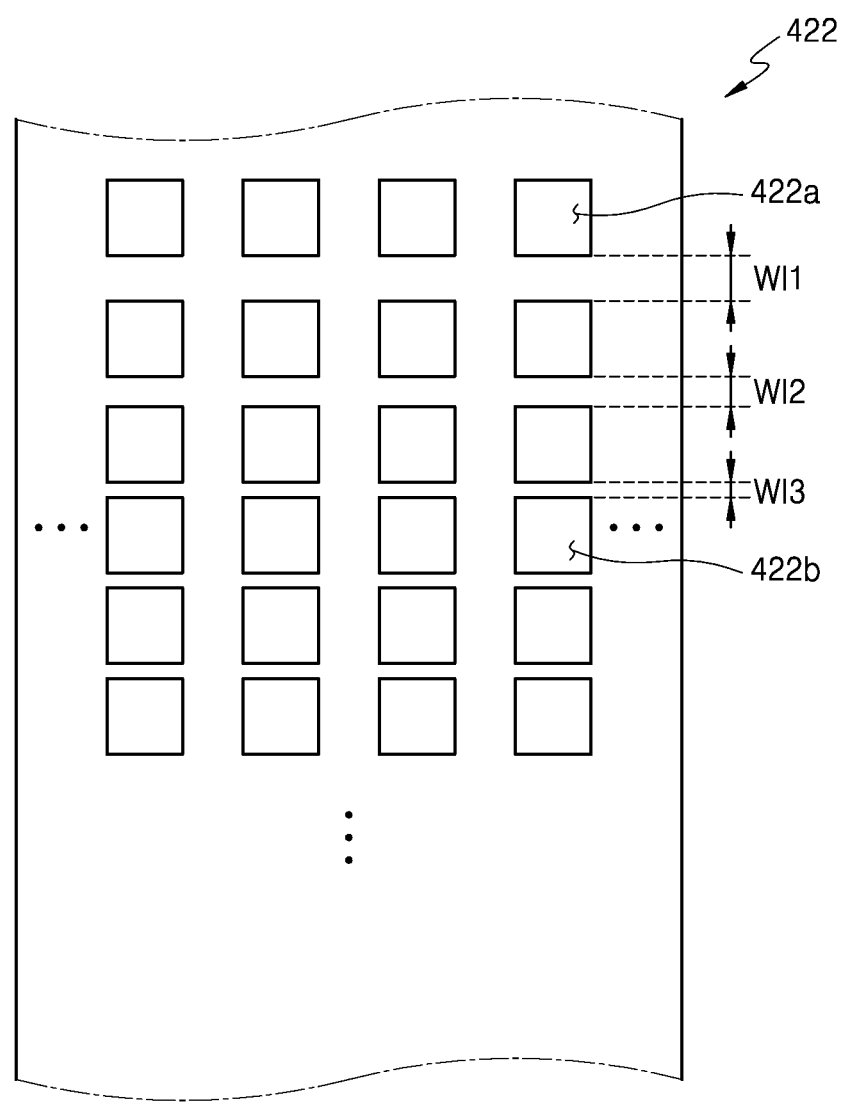
FIG. 25 is a plan view illustrating a part of a mask sheet according to an embodiment.

FIG. 24 is a plan view illustrating a display area and a non-display area of a display panel according to an embodiment. FIG. 25 is a plan view illustrating a part of a mask sheet according to an embodiment.

Referring to FIGS. 24 and 25, an apparatus for manufacturing a display apparatus which is similar to or different from the embodiment of FIG. 20 may be applicable to the following description.

The mask sheet 422 may include the first opening 422a and the second opening 422b. For example, the first opening 422a may have a substantially square shape, and the second opening 422b may have substantially the same shape as that of the first opening 422a. For example, the first distance WI1 between the first openings 422a that are adjacent to each other from among the first openings 422a and the second openings 422b that are aligned with each other may be different from the third distance WI3 between the second openings 422b that are adjacent to each other. For example, the third distance WI3 may be less than the first distance WI1. The third distance WI3 may be less than the second distance WI2 between the first opening 422a and the second opening 422b that are adjacent to each other. For example, the second distance WI2 may be substantially the same as the first distance WI1.

A method of forming a counter electrode by using the apparatus for manufacturing the display apparatus may be similar to that described with reference to FIGS. 20 and 21. The first counter electrode 230a may be formed in the first display area DA1, and the third counter electrode 230c may be formed in the second display area DA2 at the same time as the first counter electrode 230a is formed. For example, at least a part of the third counter electrode 230c may protrude from the second display area DA2 toward the non-display area NDA. At least a part of the third counter electrode 230c may protrude from the second display area DA2 toward the first display area DA1. The third counter electrodes 230c located or disposed in the second display area DA2 may be spaced apart from one another.

The second counter electrode 230b and the fourth counter electrode 230d may be formed by changing a position of a substrate (not shown). For example, a part of the second counter electrode 230b may overlap the first counter electrode 230a, and another part of the second counter electrode 230b may overlap the third counter electrode 230c. The first contact area CTA1 and the third contact area CTA3 may be respectively formed in overlapping portions. A part of the fourth counter electrode 230d may overlap the third counter electrode 230c, and the fourth counter electrode 230d and the third counter electrode 230c may overlap each other to form the second contact area CTA2. For example, a part of the fourth counter electrode 230d may protrude from the second display area DA2 toward the non-display area NDA.

For example, the first counter electrodes 230a and the second counter electrodes 230b may be connected to each other in a zigzag pattern or arrangement, and the third counter electrodes 230c and the fourth counter electrodes 230d may be connected to each other in a zigzag pattern or arrangement. At least one from among the third counter electrodes 230c and at least one from among the second counter electrodes 230b may be connected to each other, and at least one from among the fourth counter electrodes 230d and at least one from among the first counter electrodes 230a may be connected to each other.

Accordingly, for example, counter electrodes located or disposed in each display area may be connected to one another. By way of example, all counter electrodes located or disposed on the substrate 100 may be connected to one another. Because the connected counter electrodes are in surface contact with one another, the surface resistance of the counter electrodes may be minimized.

Because the display apparatus (not shown) secures the transmission area TA, the function of a component located or disposed in the first display area DA1 may not be deteriorated.

Figure 26:
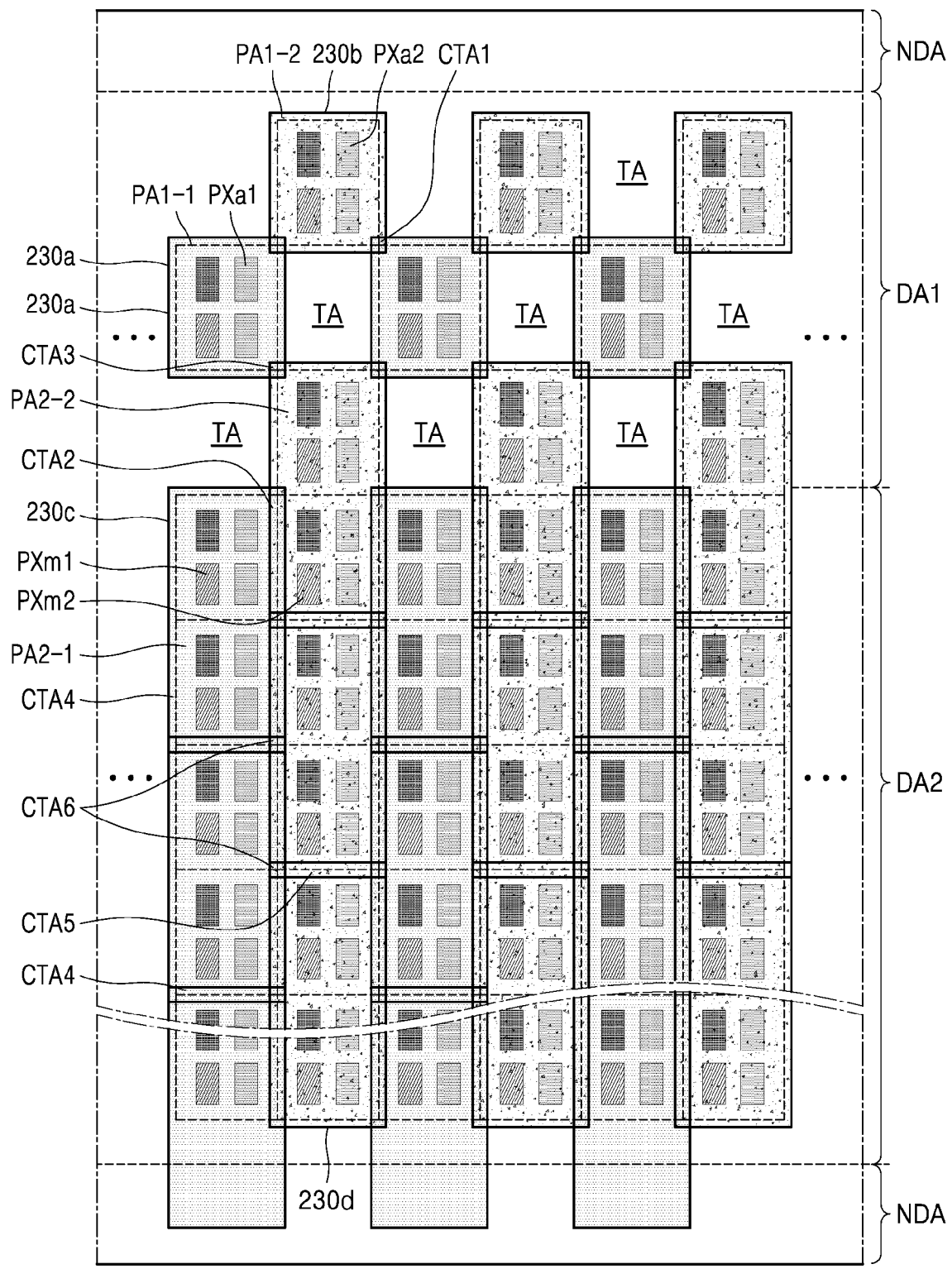
FIG. 26 is a plan view illustrating a display area and a non-display area of a display panel according to an embodiment.

FIG. 26 is a plan view illustrating a display area and a non-display area of a display panel according to an embodiment.

Referring to FIG. 26, a display panel (not shown) may include the first display area DA1, the transmission area TA, the second display area DA2, and the non-display area NDA. For example, the first display area DA1 may include the first pixel area PA1-1 and the second pixel area PA1-2. The second display area DA2 may include the third pixel area PA2-1 and the fourth pixel area PA2-2. A pixel may be located or disposed in each of the first pixel area PA1-1 through the fourth pixel area PA2-2. For example, four first pixels PXa1 may be located or disposed in the first pixel area PA1-1, and four second pixels PXa2 may be located or disposed in the second pixel area PA1-2. Four third pixels PXm1 and four fourth pixels PXm2 may be respectively located or disposed in the third pixel area PA2-1 and the fourth pixel area PA2-2. For example, each pixel may have a substantially rectangular shape, and two from among four pixels located or disposed in one pixel area may have the same color.

The first counter electrode 230a may be located or disposed in the first pixel area PA1-1, the second counter electrode 230b may be located or disposed in the second pixel area PA1-2, the third counter electrode 230c may be located or disposed in the third pixel area PA2-1, and the fourth counter electrode 230d may be located or disposed in the fourth pixel area PA2-2. For example, some portions of the first counter electrode 230a through the fourth counter electrode 230d may overlap each other to form a contact area. For example, the first contact area CTA1 may be formed so that the first counter electrode 230a and the second counter electrode 230b overlap each other, and the second contact area CTA2 may be formed so that the third counter electrode 230c and the fourth counter electrode 230d overlap each other. The third contact area CTA3 may be formed so that the first counter electrode 230a and the fourth counter electrode 230d overlap each other. The fourth contact area CTA4 may be formed so that the third counter electrodes 230c that are adjacent to each other overlap each other, and the fifth contact area CTA5 may be formed so that the fourth counter electrodes 230d that are adjacent to each other overlap each other. The sixth contact area CTA6 may be formed so that the third counter electrodes 230c that are adjacent to each other, the second contact area CTA2, and the fourth counter electrode 230d overlap one another.

Accordingly, for example, counter electrodes located or disposed in each display area may be connected to one another. By way of example, all counter electrodes located or disposed on the substrate 100 may be connected to one another. Because the connected counter electrodes are in surface contact with one another, the surface resistance of the counter electrodes may be minimized.

Because the display apparatus 1 secures the transmission area TA, the function of a component located or disposed in the first display area DA1 may not be deteriorated.

Figure 27:
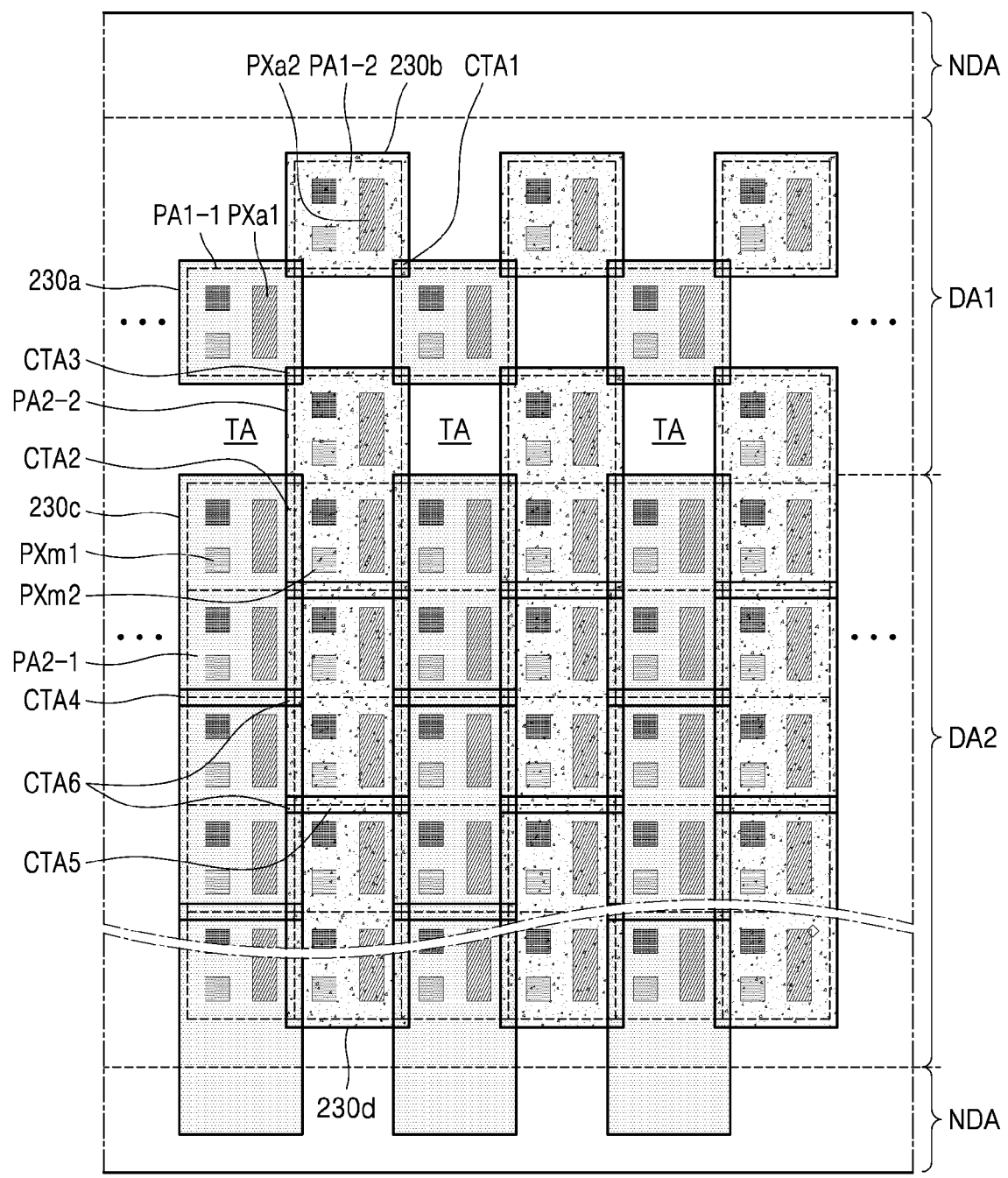
FIG. 27 is a plan view illustrating a display area and a non-display area of a display panel according to an embodiment.

FIG. 27 is a plan view illustrating a display area and a non-display area of a display panel according to an embodiment.

Referring to FIG. 27, three pixels may be located or disposed in each pixel area. A size of one of the three pixels in one pixel area may be greater than a size of the remaining two pixels of the three pixels. For example, one of the three pixels may have a substantially rectangular shape, and the remaining two pixels of the three pixels may each have a substantially square shape.

Figure 28:
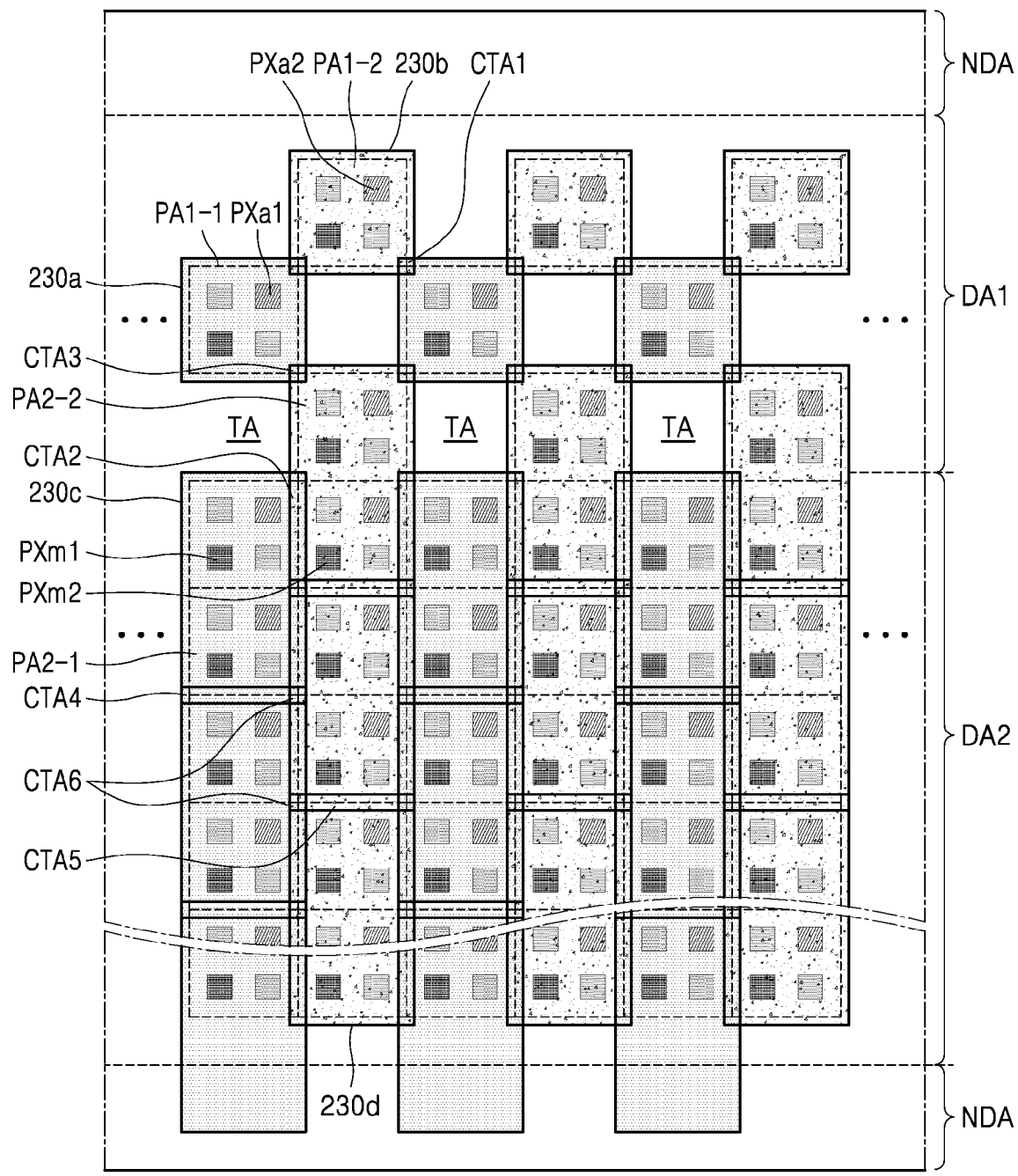
FIG. 28 is a plan view illustrating a display area and a non-display area of a display panel according to an embodiment.

FIG. 28 is a plan view illustrating a display area and a non-display area of a display panel according to an embodiment.

Referring to FIG. 28, four pixels may be located or disposed in each pixel area. For example, the four pixels located or disposed in one pixel area may have substantially the same size.

Figure 29:
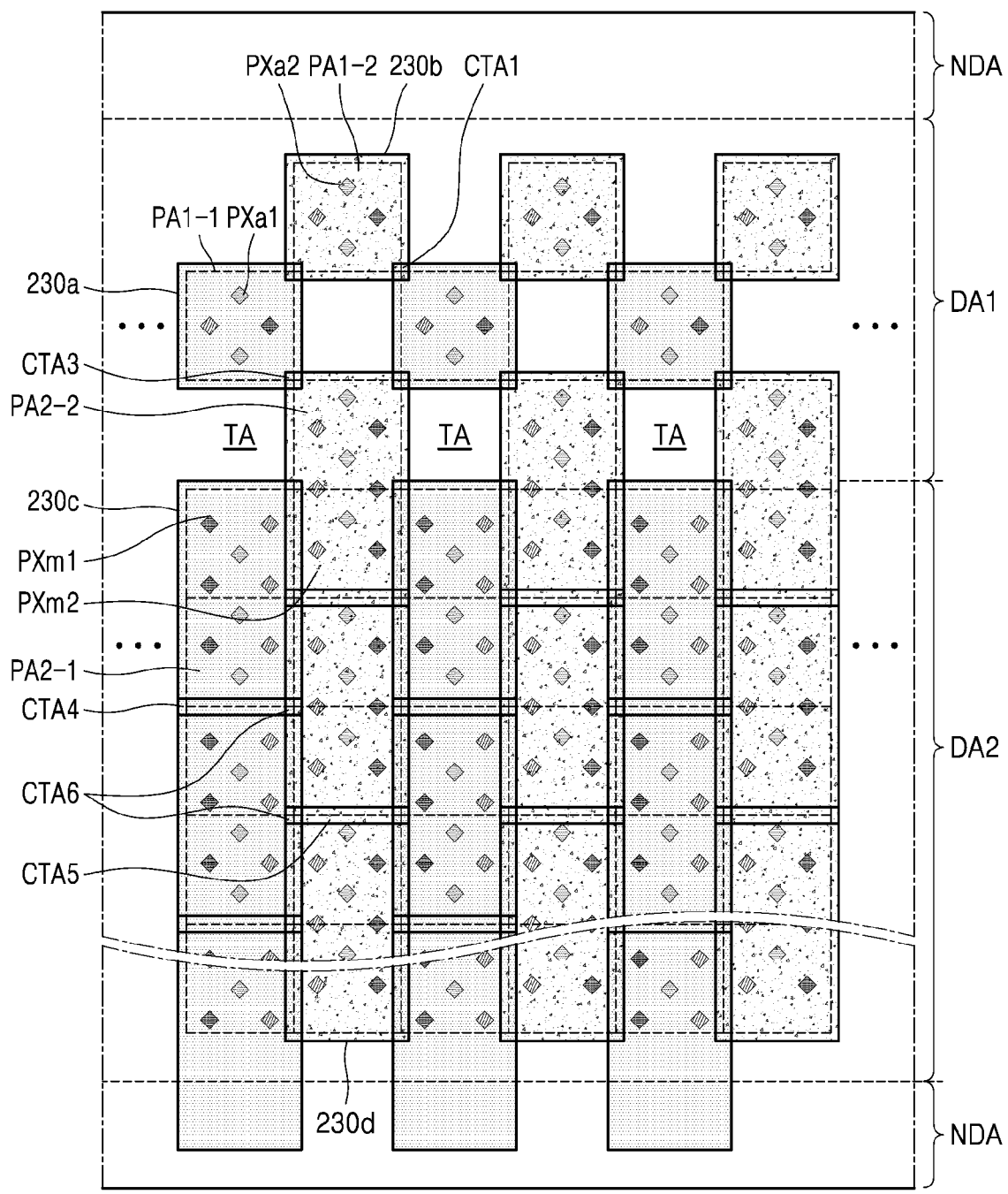
FIG. 29 is a plan view illustrating a display area and a non-display area of a display panel according to an embodiment.

FIG. 29 is a plan view illustrating a display area and a non-display area of a display panel according to an embodiment.

Referring to FIG. 29, pixels may be arranged in a diamond shape. For example, each of the first counter electrode 230a and the second counter electrode 230b located or disposed in the first display area DA1 may cover four pixels, and each of the third counter electrode 230c and the fourth counter electrode 230d located or disposed in the second display area DA2 may cover nine pixels. However, the embodiment is not limited thereto and any number of pixels may be covered by the counter electrodes.

As described above, according to an embodiment, there may be provided a display panel in which a display area is extended to display an image even in an area where a component is located or disposed, and a display apparatus including the display panel. However, the scope of the disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate comprising a first display area and a second display area, the first display area comprising a first pixel area, a second pixel area, and a transmission area;
    a first pixel disposed in the first pixel area, the first pixel comprising a first pixel electrode, a first counter electrode, and a first intermediate layer disposed between the first pixel electrode and the first counter electrode; and
    a second pixel disposed in the second pixel area, the second pixel comprising a second pixel electrode, a second counter electrode, and a second intermediate layer disposed between the second pixel electrode and the second counter electrode, wherein
    the first counter electrode is disposed in the first pixel area,
    the second counter electrode is disposed in the second pixel area,
    the first counter electrode and the second counter electrode comprise a first contact area where the first pixel area and the second pixel area are adjacent to each other, and
    the first pixel area and the transmission area are alternately arranged in a first direction, and the second pixel area and the transmission area are alternately arranged in a second direction.

2. The display apparatus of claim 1, wherein
    the first counter electrode and the second counter electrode are electrically connected to each other through the first contact area.

3. The display apparatus of claim 1, wherein
    the first pixel area, the second pixel area, and the transmission area are alternately arranged in a lattice shape.

4. The display apparatus of claim 1, wherein
    the transmission area is defined by the first pixel area and the second pixel area that are adjacent to each other.

5. The display apparatus of claim 1, wherein
    the first contact area is an area where the first counter electrode and the second counter electrode are in surface contact with each other.

6. The display apparatus of claim 1, wherein,
    the second counter electrode is disposed on the first counter electrode in the first contact area.

7. The display apparatus of claim 1, further comprising a pixel-defining layer disposed on the first pixel electrode and the second pixel electrode, the pixel-defining layer comprising a first opening and a second opening through which portions of the first pixel electrode and the second pixel electrode are respectively exposed,
    wherein the first contact area is disposed on the pixel-defining layer.

8. The display apparatus of claim 1, wherein
    light transmittances of the first display area and the second display area are different from each other.

9. The display apparatus of claim 1, wherein
    a resolution of an image provided in the first display area is less than a resolution of an image provided in the second display area.

10. The display apparatus of claim 1, wherein the second display area comprises a third pixel area and a fourth pixel area that are adjacent to each other,
    wherein the display apparatus further comprises:
    a third pixel disposed in the third pixel area, the third pixel comprising a third pixel electrode, a third counter electrode, and a third intermediate layer disposed between the third pixel electrode and the third counter electrode; and
    a fourth pixel disposed in the fourth pixel area, the fourth pixel comprising a fourth pixel electrode, a fourth counter electrode, and a fourth intermediate layer disposed between the fourth pixel electrode and the fourth counter electrode,
wherein the third counter electrode and the fourth counter electrode comprise a second contact area where the third pixel area and the fourth pixel area are adjacent to each other.

11. The display apparatus of claim 10, wherein the third counter electrode and the fourth counter electrode are electrically connected to each other through the second contact area.

12. The display apparatus of claim 10, wherein the third counter electrode or the fourth counter electrode protrudes toward the first display area, and
the third counter electrode is electrically connected to the first counter electrode or the fourth counter electrode is electrically connected to the second counter electrode to form a third contact area.

13. The display apparatus of claim 12, wherein, the fourth counter electrode is disposed on the first counter electrode in the third contact area.

14. The display apparatus of claim 12, further comprising a pixel-defining layer disposed on the third pixel electrode and the fourth pixel electrode,
wherein at least one of the second contact area and the third contact area is disposed on the pixel-defining layer.

15. The display apparatus of claim 10, wherein, the fourth counter electrode is disposed on the third counter electrode in the second contact area.

16. The display apparatus of claim 10, wherein the third counter electrode, the fourth counter electrode, and the second contact area are disposed to cover an entire surface of the second display area.

17. The display apparatus of claim 10, wherein each of the third counter electrode and the fourth counter electrode has a stripe shape.

18. The display apparatus of claim 10, wherein the first counter electrode and the third counter electrode are aligned with each other, and
the second counter electrode and the fourth counter electrode are aligned with each other.

19. The display apparatus of claim 10, wherein the substrate comprises a non-display area surrounding at least a part of the second display area,
wherein at least one of the third counter electrode and the fourth counter electrode protrudes from the second display area toward the non-display area.

20. A display apparatus comprising:
a substrate comprising a first display area and a second display area, the first display area comprising a first pixel area, a second pixel area, and a transmission area;
a first pixel disposed in the first pixel area, the first pixel comprising a first pixel electrode, a first counter electrode, and a first intermediate layer disposed between the first pixel electrode and the first counter electrode;
a second pixel disposed in the second pixel area, the second pixel comprising a second pixel electrode, a second counter electrode, and a second intermediate layer disposed between the second pixel electrode and the second counter electrode; and
a component disposed on one surface of the substrate to correspond to the first display area, the component comprising an electronic element that is capable of emitting or receiving, wherein
the first counter electrode is disposed in the first pixel area,
the second counter electrode is disposed in the second pixel area, and
the first counter electrode and the second counter electrode comprise a first contact area where the first pixel area and the second pixel area are adjacent to each other.

21. The display apparatus of claim 20, wherein the first counter electrode and the second counter electrode are electrically connected to each other though the first contact area.

22. The display apparatus of claim 20, wherein the component emits or receives light through the transmission area, and
a light transmittance of the second display area is less than a light transmittance of the first display area.

23. A method of manufacturing a display apparatus, the method comprising:
disposing a substrate and a mask assembly inside a chamber;
passing a deposition material supplied by a deposition source through the mask assembly to form a first counter electrode and a third counter electrode respectively in a first display area and a second display area of the substrate;
changing a position of at least one of the substrate and the mask assembly; and
passing the deposition material supplied by the deposition source through the mask assembly to form a second counter electrode at least partially overlapping the first counter electrode in the first display area and disposing a transmission area defined b the first counter electrode and the second counter electrode, and a fourth counter electrode at least partially overlapping the third counter electrode in the second display area.

24. The method of claim 23, further comprising:
forming a first contact area where the first counter electrode and the second counter electrode overlap each other, and
forming a second contact area where the third counter electrode and the fourth counter electrode overlap each other.

25. The method of claim 24, wherein the first contact area and the second contact area are formed on a pixel-defining layer.

26. The method of claim 23, wherein disposing the substrate comprises:
disposing a non-display area surrounding at least a part of the second display area, and
disposing a part of at least one of the third counter electrode and the fourth counter electrode to protrude from the second display area toward the non-display area.

27. The method of claim 23, further comprising:
forming the third counter electrode, the fourth counter electrode, and a second contact area where the third counter electrode and the fourth counter electrode overlap each other to cover an entire surface of the second display area.

28. The method of claim 23, further comprising
forming a first contact area where the first counter electrode and the second counter electrode overlap each other and are in surface contact with each other.

29. The method of claim 23, further comprising
forming a second contact area where the third counter electrode and the fourth counter electrode overlap each other and are in surface contact with each other.

30. The method of claim 23, wherein
light transmittances of the first display area and the second display area are different from each other.

31. The method of claim 23, further comprising:
forming a third contact area where at least one of the third counter electrode and the fourth counter electrode protrudes toward the first display area, wherein the third contact area is electrically connected to at least one of the first counter electrode and the second counter electrode.

32. The method of claim 23, wherein
forming the first counter electrode comprises forming a plurality of first counter electrodes,
at least one of the plurality of the first counter electrodes and the third counter electrode are arranged in a first direction, and
others of the plurality of the first counter electrodes are arranged in a second direction different from the first direction.

33. The method of claim 32, further comprising:
forming the first counter electrode and the second counter electrode to be connected in a third direction different from the first direction and the second direction.

\* \* \* \* \*